United States Patent
Van Den Ende et al.

(10) Patent No.: US 11,362,258 B2
(45) Date of Patent: Jun. 14, 2022

(54) EAP ACTUATOR AND DRIVE METHOD

(71) Applicant: KONINKLIJKE PHILIPS N.V., Eindhoven (NL)

(72) Inventors: Daan Anton Van Den Ende, Breda (NL); Mark Thomas Johnson, Arendonk (BE); Roland Alexander Van De Molengraaf, Geldrop (NL); Achim Hilgers, Alsdorf (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 748 days.

(21) Appl. No.: 16/311,244

(22) PCT Filed: Jun. 22, 2017

(86) PCT No.: PCT/EP2017/065327
§ 371 (c)(1),
(2) Date: Dec. 19, 2018

(87) PCT Pub. No.: WO2018/001839
PCT Pub. Date: Jan. 4, 2018

(65) Prior Publication Data
US 2019/0237651 A1    Aug. 1, 2019

(30) Foreign Application Priority Data

Jun. 29, 2016  (EP) .................................... 16176918
Jul. 1, 2016   (EP) .................................... 16177611
Jul. 6, 2016   (EP) .................................... 16178110

(51) Int. Cl.
*H01L 41/04*    (2006.01)
*H01L 41/09*    (2006.01)
(Continued)

(52) U.S. Cl.
CPC .......... *H01L 41/042* (2013.01); *G01H 11/06* (2013.01); *G06F 3/016* (2013.01);
(Continued)

(58) Field of Classification Search
CPC .. H01L 41/042; H01L 41/0825; H01L 41/096
(Continued)

(56) References Cited

U.S. PATENT DOCUMENTS 6,155,500 A    12/2000  Takase
6,454,377 B1    9/2002  Ishizaki
(Continued)

FOREIGN PATENT DOCUMENTS

EP    0995599 A2    4/2000
EP    0995899 A2    4/2000
(Continued)

OTHER PUBLICATIONS

Chae et al "Enhancement of Response Speed of Viscous Fluids Using Overdrive Voltage" Sensors and Actuators, B 209 (2015) p. 56-60.

*Primary Examiner* — Derek J Rosenau
(74) *Attorney, Agent, or Firm* — Schott, P.C.

(57) ABSTRACT

An electroactive polymer actuator includes an electroactive polymer structure and a driver for providing an actuation drive signal. In one aspect, a first drive level is used to charge the electroactive polymer structure from a non-actuated state to an actuated state. When or after the electroactive polymer structure reaches the actuated state, a lower second drive level is used to hold the electroactive polymer structure at the actuated state. This temporary overdrive scheme improves the speed response without damaging the electroactive polymer structure. In another aspect, a driving method makes use of several different level (Continued)

segments over time, which compensates for the delayed actuation response of the EAP actuator.

16 Claims, 11 Drawing Sheets

(51) Int. Cl.
 H01L 41/193 (2006.01)
 G01H 11/06 (2006.01)
 G06F 3/01 (2006.01)
 H01L 41/08 (2006.01)
 H01L 41/45 (2013.01)

(52) U.S. Cl.
 CPC ...... *H01L 41/0825* (2013.01); *H01L 41/0986* (2013.01); *H01L 41/193* (2013.01); *H01L 41/45* (2013.01)

(58) Field of Classification Search
 USPC .......................................................... 310/317
 See application file for complete search history.

(56) References Cited

U.S. PATENT DOCUMENTS

| | | | |
|---|---|---|---|
| 6,882,086 | B2 | 4/2005 | Kornbluh et al. |
| 8,866,601 | B2 | 10/2014 | Cruz-Hernandez et al. |
| 2003/0067245 | A1 | 4/2003 | Pelrine et al. |
| 2010/0245313 | A1 | 9/2010 | Lewis et al. |
| 2013/0241349 | A1* | 9/2013 | Nitta ............... B41J 2/04581 310/317 |
| 2013/0264972 | A1 | 10/2013 | Hashimoto et al. |
| 2013/0272902 | A1 | 10/2013 | Noth et al. |
| 2014/0035735 | A1 | 2/2014 | Zellers et al. |
| 2014/0085065 | A1 | 3/2014 | Biggs et al. |
| 2014/0274634 | A1 | 9/2014 | Aganovic et al. |
| 2014/0327530 | A1 | 11/2014 | Lacroix et al. |
| 2015/0043079 | A1 | 2/2015 | Park et al. |

FOREIGN PATENT DOCUMENTS

| | | |
|---|---|---|
| EP | 2654194 A1 | 10/2013 |
| JP | 2000-117980 A | 4/2000 |
| JP | 2005253212 A | 9/2005 |

\* cited by examiner

EAP ACTUATOR AND DRIVE METHOD

CROSS-REFERENCE TO PRIOR APPLICATIONS

This application is the U.S. National Phase application under 35 U.S.C. § 371 of International Application No. PCT/EP2017/065327, filed on Jun. 22, 2017, which claims the benefit of EP Patent Application No. EP 16176918.7 filed on Jun. 29, 2016; EP Patent Application No. EP 16177611.7 filed Jul. 1, 2016 and EP Patent Application No. EP16178110.9 filed Jul. 6, 2016. These applications are hereby incorporated by reference herein.

FIELD OF THE INVENTION

This invention relates to a EAP actuators, devices or systems including such actuators and methods for driving such actuators, devices or systems. It further relates to a computer implemented invention for performing the method of the invention.

BACKGROUND OF THE INVENTION

Electroactive polymer actuators are devices that can transform an electrical input to (mechanical) output such as e.g. force or pressure or vice versa. Thus EAP actuators can be used as mechanical actuators and, depending on the EAPs used, often also as sensors. To this end they comprise electroactive polymers (EAP) which can deform or change shape under the influence of an actuation stimulus or signal. Some examples of field-driven EAPs include Piezoelectric polymers, Electrostrictive polymers (such as PVDF based relaxor polymers) and Dielectric Elastomers, but others exist.

EAP actuators can be easily manufactured into various shapes allowing easy integration into a large variety of systems such as for example medical or consumer devices. Further, EAP based actuators/sensors combine high stress and strain with characteristics such as: low power, small form factor, flexibility, noiseless operation, accurate operation, the possibility of high resolution, fast response times, and cyclic actuation.

Typically, their characteristics render an EAP actuator useful for e.g. any application where little space is available and in which a small amount of movement of a component or feature is desired, based on electric actuation. Similarly, the technology can be used for sensing small movements.

FIGS. 1 and 2 show two possible operating modes for an exemplary EAP actuator. It comprises an EAP structure including an EAP layer 14 sandwiched between electrodes 10, 12 on opposite sides of the EAP layer 14. FIG. 1 shows an actuator which is not clamped by (attached to) any carrier layer or substrate. A drive voltage applied to the electrodes is used to cause the EAP layer to expand in all directions as shown. FIG. 2 shows an actuator which is designed so that the expansion arises only in one direction. In this case a similar EAP structure as the one of FIG. 1 is supported and clamped, i.e. mechanically attached to a carrier layer 16. A voltage applied to the electrodes is again used to cause the EAP layer to expand in all directions as indicated for FIG. 1. However, the clamping confines the actual expansion such that a bowing of the entire structure is caused instead. Thus, the nature of this bending movement arises from the interaction between the passive carrier layer and the active layer which expands when actuated.

EP 2 654 194 discloses a contraction gel actuator in which position detection and feedback is used to control the actuation of the actuator, in order to enable more accurate position control.

SUMMARY OF THE INVENTION

It appears that when an EAP actuator, such as the one of FIGS. 1 and 2, is activated, the actual desired actuation output deviates from the desired one with respect to stability of the initially attained and to be held actuation. For example, many EAP actuators do not provide positional stability in response to a step voltage when this is held over a long time period, where long is e.g. to be construed as on second or longer timescale. This discrepancy hampers application of EAP actuators for precise positioning of components, such as e.g. in miniature fluid control valves, micro mirrors or sensors, as a mechanical response is difficult to hold substantially constant.

It is an object of the invention to provide an improved EAP actuator with respect to at least the stability of holding of the actuation response.

This object is at least partly achieved by the invention as defined by the independent claims. The dependent claims provide advantageous embodiments.

The device and method of the invention use an actuator that comprises an electroactive polymer structure for providing a mechanical actuation output dependent on a drive signal supplied to it. Such signal can be applied to it using electrodes that may be part of the EAP structure. Thus, a first signal level makes the structure attain a first actuation state while a second signal level different from the first signal level makes it attain a second actuation state different from the first actuation state. The electroactive polymer structure comprises an electroactive polymer (EAP) to this end which is capable of changing its shape upon application of the drive signal. Examples of such EAP structures are described with reference to FIGS. 1 and 2, but others exist and the invention is not limited to these examples.

The invention is based on the insight that an EAP structure is subject to relaxation properties under constant driving conditions. Thus the device and drive method of the invention provides a step increase to at least an intermediate voltage and a subsequent more gradual decrease over time from the intermediate voltage to the second voltage.

With the device and method of the invention the actuator can be controlled to stabilise an initially reached and desired actuated state by compensating for one or more of the relaxation properties, and this can widen the scope of potential applications of EAP actuators.

The actuator includes an electroactive polymer actuator. The electroactive polymer structure comprises an electroactive polymer material which is capable of allowing or inducing (substantial) mechanical deformation upon subjecting it to the drive signal.

The EAP structure can comprise an electrode structure for receiving the electrical drive signal. The electrode structure can comprise two electrodes with the EAP in between for example as part of a stack of layers.

The drive signal can be based on voltage driving such that signal levels are voltage levels or be based on current driven such that signal levels are current levels. Note that also with current driving the signal levels can be voltage levels arising due to currents set by a driver. For field driven EAP structures, voltage driving is preferably used.

The actuation output of the actuator is dependent on (caused by) a deformation of the EAP structure. The actuation state output can be any type of mechanical actuation such as a force, pressure or strain with or without an actual substantial mechanical movement, displacement, deformation or stroke of the actuator structure.

The first actuation state can be the non-actuated state (also referred to as rest-state) without any electrical drive signal provided to the device. Alternatively, the first actuation state can be an actuated state different from the second actuation state. The actuator can have more than the first and second actuation states (e.g. a plurality of states).

The drive signal during the first period is for actuating the EAP structure to an intermediate actuation state. The intermediate state can be the same as the second actuation state, but does not need to be the same. Thus, directly after the first period, the actuator may or may not have reached the second state.

During the first period, the drive signal level can have only a step increase. It may also have a sub-period in which the drive signal level is substantially constant at the intermediate signal level. These are simple implementations. There may be more complex drive signal applied with multiple signal levels (constant or variable) or one continuously varying signal level. In all of these, at the end of the first period the electrical drive signal attains the intermediate level.

The second period directly follows on the first period and is not a substantially zero time period. The second period is also referred to as the holding period.

The drive signal during the second period is for keeping the second actuation state more constant than when during the second period a constant drive signal level would have been used. This drive scheme thus compensates for relaxation of the EAP actuator over time and allows a longer actuation period with a more constant held displacement (actuation state). In other words, the second period drive signal with decreasing second level and therewith the overall drive scheme is for causing that the actual actuation variation during the second period is less than when a constant second level would have been used during the second period. Since the relaxation generally causes an ongoing increase of the actuation with already constant second level, the decrease may compensate for the increase such that the variation in actuation is less and thereiwth the actuation is more constant. In the ultimate situation, with nearly perfect match between relaxation induced increase and adapted decrease of second level, a substantially constant actaution can be achieved during the major part or entire second period up till a point when the decreasing signal is no longer needed for compensation since relaxation has then ended as of that point.

The method and driver may be adapted additionally to provide the second voltage as a constant drive voltage after the decrease over time. This functions as a hold voltage after the compensation for all relaxation effects.

The method and driver may be adapted such that the intermediate level is at least 5%, or at least 10%, or at least 20% higher than the second level. The second period preferably is equal to, or longer than 0.5 seconds. Preferably it is longer than 1 seconds or even longer than 2 or 5 seconds. Relaxation effects in polymeric materials occur over seconds so that effective compensation can take place in this case.

The electroactive polymer structure comprises an electrode arrangement for receiving the drive signal, the electrode arrangement defining a capacitor having an electrical capacitance in series connection with a resistance, the product of the capacitance and resistance defining a characteristic time constant for charging the capacitor during the first period. The method and driver may thus be adapted such that the first period is equal to or longer than the product of a factor and the characteristic time constant where the factor is chosen form the group consisting of: 2, 5, 10, 20 50, 100. If the capacitance is different for the first and second actuation states, which often is the case for EAP structures, then e.g. an average or the highest capacitance of the two may be used in the Product. This gives time to allow complete charge buildup. Hence, initial electrical driving by steady state electrical charging is largely finished within the first period. Hence, the second period is mainly concerned with the relaxation effects.

In the invention the decrease of drive signal level during the second period can occur in a stepwise fashion. Possibly in combination with constant signal between steps. This may allow use of simpler drivers. The decrease can be in continuous fashion. Hence more precise compensation for the relaxation effects can be provided.

The decrease over time may be a linearly decreasing portion. Alternatively, the decrease over time may be a first decreasing portion and a subsequent second decreasing portion with different average slopes, i.e. rates of decrease. The first portion may have a duration of between 0.5 and 5 s and the second portion may have a duration exceeding 1 second. Preferably it exceeds 2, 5 or even 10 seconds. It may be shorter than 20 seconds. The first portion may have a negative average slope with a steeper gradient than the second portion. The two portions may be linearly decreasing portions.

The rate of decrease of the drive signal can be constant over time during the second period or one or more of its portions. This gives constant compensation over time when relaxation effects continue to occur. This may happen with current driven EAPs. Alternatively, the rate of decrease of the drive signal can decrease over time. This may be used when relaxation effects become less and less over time.

During the entire or part of the first period the drive signal level can be kept at an overdrive level higher than (for switching to higher actuation state), or lower than (in case of switching to lower actuation state) the intermediate level, before starting the second period. Level differences are calculated by subtracting the second mentioned value from the first mentioned value between which a difference is determined.

The overdrive level can be for part of the first period or the entire first period. It may be applied shorter than 0.5 s (for example less than 0.3 s or even less than 0.1 s). This provides an initial spike used for rapidly setting the actuation, followed by a rapid drop down to the first voltage level, before the gradual decrease. In this way, there is a short duration large overdrive, followed by a longer duration smaller overdrive, which is more gradually removed. The voltage across an effective capacitance of the electroactive polymer structure may be at or below the second drive voltage during the overdrive voltage.

The initial overdrive signal is used to reduce the delay in reaching an actuated state, and this can widen the scope of potential applications of EAP actuators. The overdrive is of limited duration. This initial part of the drive waveform takes account of the capacitive nature of the EAP structure, which is actuated by charge injection. By increasing the drive voltage, additional charge is delivered to the electroactive polymer structure, but without the voltage across the EAP structure exceeding limits.

A feedback system may be provided for controlling the duration, amplitude and/or shape of the drive signal during at least the second period. Thus, the selection of the drive signal profile during the second period can be passive or active. The feedback system may comprise a displacement sensor or a closed loop driver control for regulating the drive level.

The invention relates to a method and a driver. The driver can be adapted to perform the method when used. Hence advantages described for the method hold also for the device. The device can have a CPU for executing the computer program product. It may even have a memory for storing this computer program product such that the CPU can run it from that memory.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a method for operating an actuator device that includes an electroactive polymer (EAP) actuator. It also provides such an actuator device adapted to perform the method. The device to this end includes a driver capable of providing the drive signals according to the method. In the method, a first drive voltage is used to drive the EAP structure from a first actuation state (which can be the non-actuated or rest state) to a second actuation state. When or after the EAP structure reaches the second actuation state, the drive voltage is adjusted to substantially steadily hold the EAP structure at the second actuated state. The adjusted drive voltage thus makes use of different voltage segments over time which compensate for the delayed actuation response of the EAP structure caused by relaxation effects occurring in the EAP structure.

Figure 1:
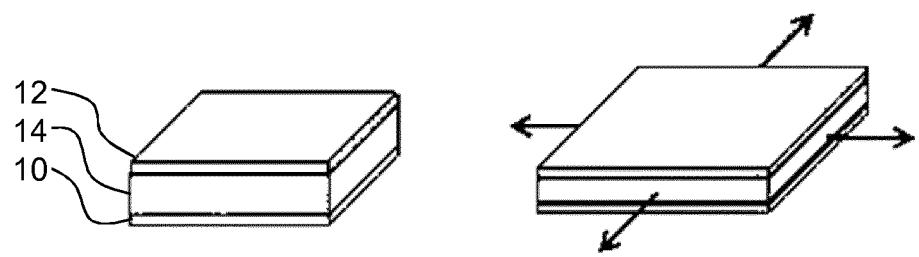
FIG. 1 shows a known EAP actuator, which is unconstrained and thus expands in plane.
Figure 2:
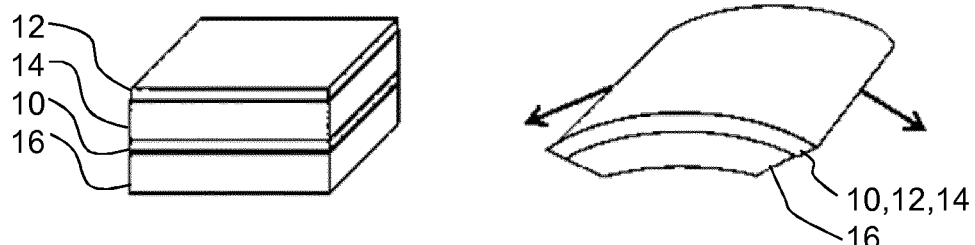
FIG. 2 shows a known EAP actuator, which is constrained and thus deforms output of plane.

Example EAP structures have been described hereinbefore with reference to FIGS. 1 and 2. In the description herein below actuators have been used of the type of FIG. 2, but with multiple stacks of the same EAP material sandwiched between two electrodes. They operate according to the same principle as the actuator of FIG. 2.

Typically an EAP actuator device includes a driver for supplying the drive signal to the EAP structure of the actuator. The driver can therewith control the actuator. The driver usually includes a driving circuit for providing the required electrical drive signal to the electrodes. The electrical drive signal can include or be a voltage driven signal or a current driven signal, which requires either a voltage driver or a current driver. In both cases, driving of the actuator will cause a voltage difference to develop between the electrodes.

When the EAP structure is being activated, the driver applies (or even generates) a voltage amplitude (alternating such as AC, slowly varying, quasi static, or static such as DC) to the electrodes to therewith bring the EAP structure into the desired actuation state (e.g. actuation position).

Both EAP structures and electronic driving circuits are not ideal. On one hand an electronic driving circuit always has internal resistances. The actuation response of an EAP actuator is therefore not only a function of the EAP structure itself but also of the driving circuit. In order to reduce the impact of the driver, the operating voltage for the EAP is usually stored in a capacitor, parallel to the EAP, and in terms of actuation this stored voltage is fed by an electronic switch (e.g. transistor, MOSFET) to the EAP actuator.

Figure 3A:
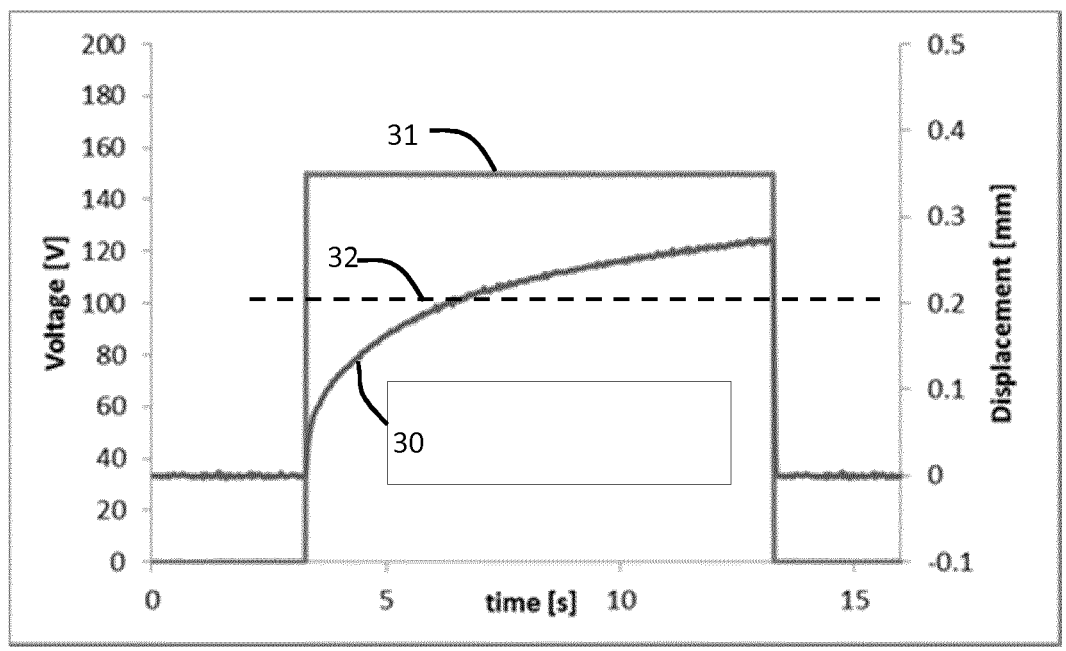
FIG. 3 shows an equivalent circuit of an EAP actuator.

Thus, when an actuator of the type of FIG. 2 is driven from its rest state (first actuation state) to a desired actuation state (second actuation state), the driver is utilised to provide a voltage associated with the second state. Actuation states are measured form the displacement curves of the actuator, after all, the actuator is a mechanical actuator providing a mechanical output which in this case is a deformation of the actuator resulting in a displacement of a moveable part of the actuator. FIG. 3A shows the displacement response as plot 30 of an EAP actuator to a step voltage (plot 32) of 150 V (second voltage) which is held for 10 s. The actuator was at rest state (first voltage of zero volt) at the start of actuation.

Evidently, although a step voltage drive signal is provided to the EAP structure, its actuation output is by no means following this step function. Instead a considerable delay of actuation is observed together with continuously changing actuation. The increasing of actuation displacement will further continue if the voltage had been further held for longer period than 10 seconds. A more square displacement response is highly desired. One effect is that even seconds after first provision of the drive voltage, the displacement and hence actuation continues to rise. If a long term desired actuation 34 were desired, such actuation response is inadequate.

Figure 3B:
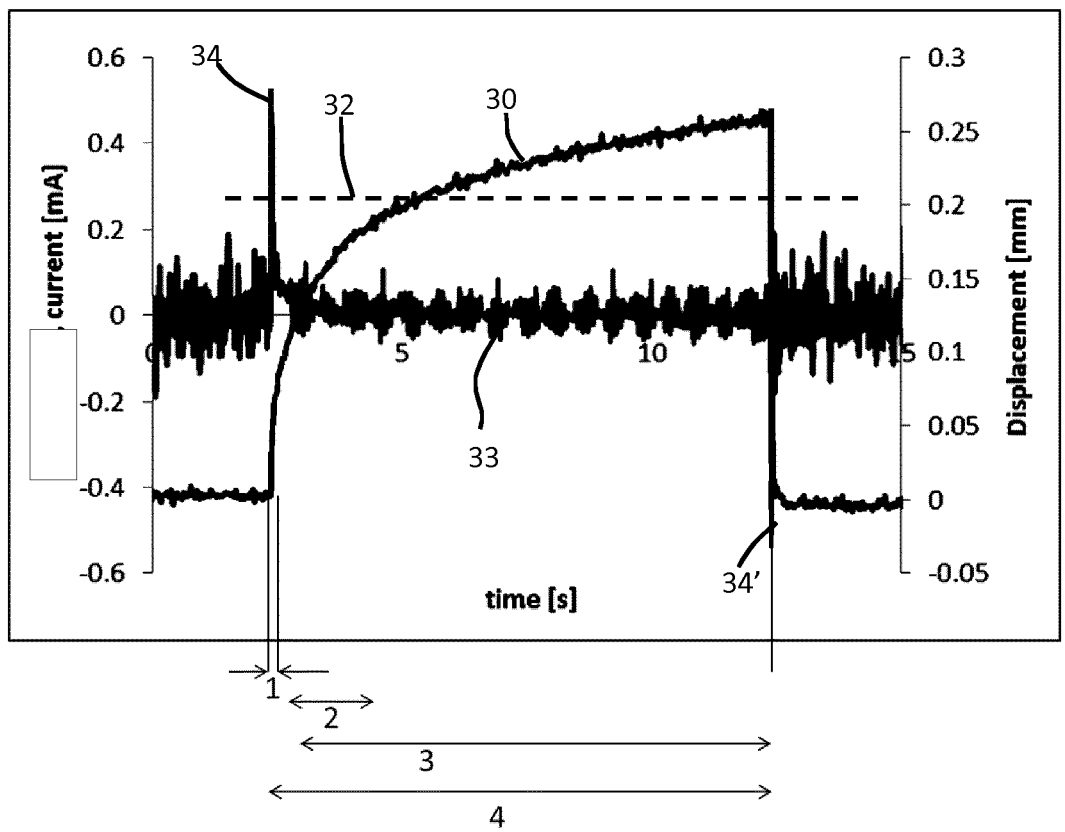

FIG. 3B shows the response of FIG. 3A, where this time additionally the current as plot 34 is shown. The step voltage plot 31 has been omitted for clarity. The current plot shows spikes 34 and 34', at the start and end of the voltage pulse 31 and these correspond to charging and discharging currents of the electrical capacitor defined by the EAP structure to provide the voltage signal to the EAP material (see also FIG. 1 explaining how the EAP material layer and electrodes form a thin film capacitor).

In FIG. 3B it can be seen that charging is thus over after about half a second. Hence, FIGS. 3A and 3B show how holding a drive voltage over a longer time period (10 s in this example) allows relaxation effects to become significant as the displacement continues to buildup after the charging. The greater portion of the displacement response is thus clearly a mechanical effect of the EAP structure and e.g. its EAP material. For relaxor ferroelectric polymers, such as used in the EAP example, there can be identified four different time regimes on a molecular level contributing to the displacement response:
1. Capacitive charging of the EAP (electrical loading increases)
2. Orientation of the molecular chains inside the polymer crystallites
3. Re-orientation of crystallite domains
4. Mechanical relaxations of the (passive) glue layers and substrate in the actuator The four effects are visualized in FIG. 3B. The four effects have an influence over different time periods as shown with reference numerals 1 to 4 beneath the x-axis. Note that the x-axis is drawn at zero current and partly obscured by the noisy current plot 34.

As shown, the effects are partially overlapping. The mechanical relaxations (4) are typically present from the beginning of the actuation since they show a passive response, i.e. are only influenced by the electrically induced displacement and will typically have a smaller effect than the (primary) electrical displacement effects. The capacitive charging is a relatively short duration effect.

It will be clear that duration and extent of each of the four effects will differ per EAP material and structure. Thus, although the above effects are primarily applicable to relaxor ferroelectric polymers, the drive schemes of the invention described below can also be applied to other polymer actuators such as the class of dielectric elastomer actuators. In this class of dielectric elastomer polymers used in an EAP actuator, the dominant deformation mechanisms are Maxwell stress and mechanical relaxations of the elastomer giving similar displacement response as that of FIGS. 3A and 3B.

The invention is aimed at reducing influence of the mechanical relaxation effects in an EAP structure and therewith enable a displacement response which more closely resembles a step mechanical response over a longer time period. Thus, once a desired level is attained it needs to be held substantially constant at for example the level 32 in FIGS. 3A and 3B.

The invention provides a drive mechanism examples of which are described below. The invention relates to the drive signal over the full duration of the actuation. However, in particular it holds beyond the electrical origin relaxation. Hence, in some cases different drive signal segments are provided over time. In the case below voltage signals are used to explain the examples. However when current driving is needed the drive signals can be current signals, although these will also provide voltage signals over the electrodes of an EAP structure.

Figure 4:
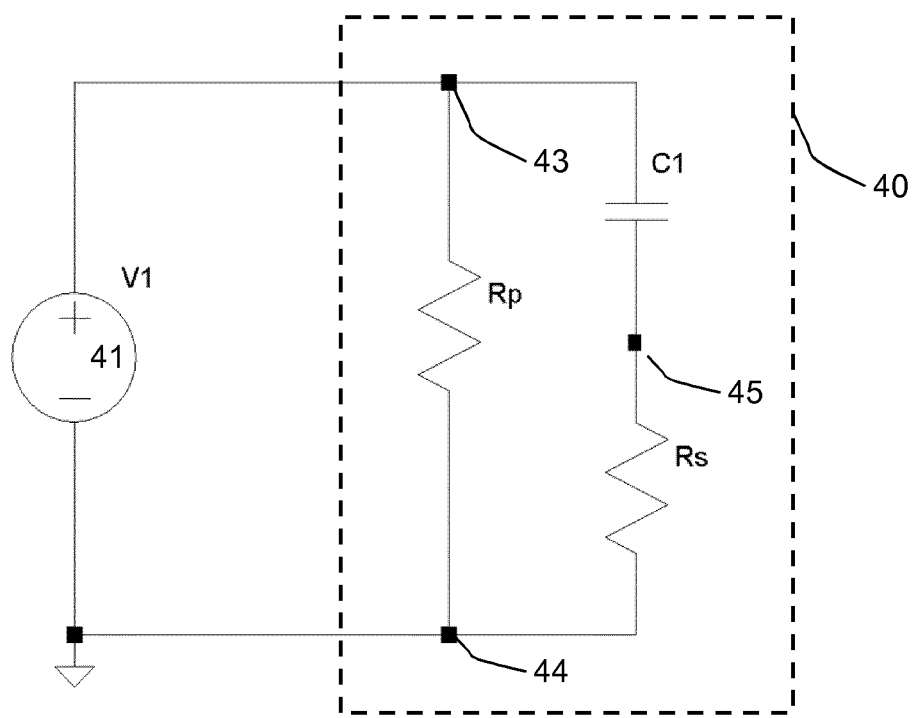
FIG. 4 shows a conventional drive scheme and a drive scheme in accordance with a first example; X-axis: 0 to 500 milliseconds with 50 ms/Div and Y axis: 0 to 270 Volts with 30 V/Div.

FIG. 4 is used to explain the electrical behaviour of an EAP structure. Since an EAP actuator behaves as an electrical load to the driver with an impedance for the driver, upon setting a certain voltage or current by the driver (as for example done in the way described herein above), the voltage difference developing across (and thus the charge on) the actuator electrodes usually is not entirely in sync with the setting of the drive signal. From an electrical point of view, an EAP actuator (such as the one of FIGS. 1 and 2) can be described as giving rise to a series connection of a resistor $R_s$ and a capacitor C1, both in parallel with a further resistor $R_p$. This, so called, equivalent RC circuit 40 describing the EAP actuator, is then connected to a driver 41 through points 43 and 44. While other RC circuits could be used for describing an EAP structure, the one of FIG. 4 describes an EAP to the first order quite well. The EAP structure deforms as a function of the electric field within the capacitor and thus as a function of the charge on this capacitor which again depends on the applied voltage provided by the driver 41. If the EAP is being deactivated, the applied voltage can be disconnected and accordingly the EAP will slowly discharge via its internal parallel resistance Rs and finally will go back to its initial position. However, other discharge methodologies can be applied in specific circumstances such as providing other voltage amplitudes as will be further described herein below.

Essentially the RC series circuit defines the electrical time constant $\tau=R_s \cdot C1$ (in seconds) which is an important parameter describing the temporal behaviour of such a configuration. As said, the mechanical displacement (i.e. movement) of an EAP actuator is related to the charge Q on the capacitor C1, which is defined by the applied voltage V1 and the capacitance itself (Q=C·V). Since the capacitance of the capacitor is a 'fixed' component with a fixed capacitance which depends on the design and construction of the actuation structure of the device (i.e. although the capacitance varies somewhat during driving, it is in first instance defined by the design configuration and EAP used and assumed to be constant for the purpose of explanation of FIG. 4), the applied voltage is the dominant parameter describing the mechanical deformation of an EAP at a steady state. The steady state would be the state used for long term holding of an actuation state.

Before a steady state is reached however, the charge stored on the capacitor C1 (and thus the voltage over the capacitor) determines the instantaneous level of actuation/displacement.

To achieve a desired actuation level of an EAP actuator, the voltage across the capacitor and thus between nodes 43 and 45 needs to reach a certain level or amplitude. Ideally this voltage level or amplitude is reached without any (noticeable) delay. However, due to the series resistance $R_s$ a delay will be introduced. For this reason, the whole charge Q required for the desired position is not built up immediately on the EAP structure, whereby the EAP structure does not directly start to actuate towards its final level with maximised speed. Instead, it heads towards a less deformed final state determined by the instantaneous charge level and with a sub optimised speed.

Without wanting to be bound by theory, in general, if a voltage $V_0$ is applied to a capacitor, the charging voltage $v_c(t)$ as a function of time t is:

$$v_c(t) = V_0 \cdot (1 - e^{-\frac{t}{\tau}}) \qquad \text{Eq. 1}$$

The time constant $\tau$ is given by the product of $R_s$ and C1.

$$\tau = Rs \cdot C1 \qquad \text{Eq. 2}$$

Thus, the charging voltage across the capacitor C1 reaches 63.2% of its final amplitude within the time constant $\tau$ and 99.3% after 5 times $\tau$.

A typical EAP actuator for example comprises a relaxor ferroelectric material or elastomeric system between electrodes. The equivalent component values for the circuit of FIG. 3 can be:
C1=800 nF
Rs=80 kΩ
Rp=10 MΩ

This gives a time constant of 0.064 s, so that five time constants (to reach driving displacement of 99.3%) corresponds to 0.32 s.

Hereinabove, the C1 was assumed to be have a constant capacitance. It appears however that for many practical EAP actuators its value varies not only during switching, but is also different for different actuator states. Hence, in going from one state to another there may be and usually is a (significant) change of C1 capacitance. This is largely due to actuator design factors that change via change of capacitor geometries (e.g. capacitor dielectric which includes the EAP layer) thickness may change and/or the electrodes area may change) and/or via change of capacitor dielectric material properties such as the dielectric constant. The latter effect is for example seen with ferroelectrics. The invention can take account of these changes. One method is to determine the electrical response time based on the highest effective capacitance of the states between which is switched. Often the most actuated state needs the highest voltage amplitude and therewith has the highest capacitance associated with it. Hence the C can be determined for anyone number of actuation voltage (steady state) levels in order to be used for any one of the calculations described herein.

The equivalent component values used above and those for any practical system can be determined using methods for impedance measurement as known in the art. The various RC models such as the one of FIG. 4 can be fitted to the results of such measurements to determine the actual resistance and capacitance values of the practical system. The effective capacitance can be determined or estimated from the value observed at steady state as then charging has ceased and a voltage is applied over the capacitance value. Voltage contributions due to leakage loss may need to be taken account of if these substantially influence the steady state voltage values.

According to the invention a driving method using a segmented drive scheme may be employed. The approach may flatten the displacement profile over time, at least in a time span longer than seconds where initial electrical charging of the structure has substantially ceased.

Figure 5A:
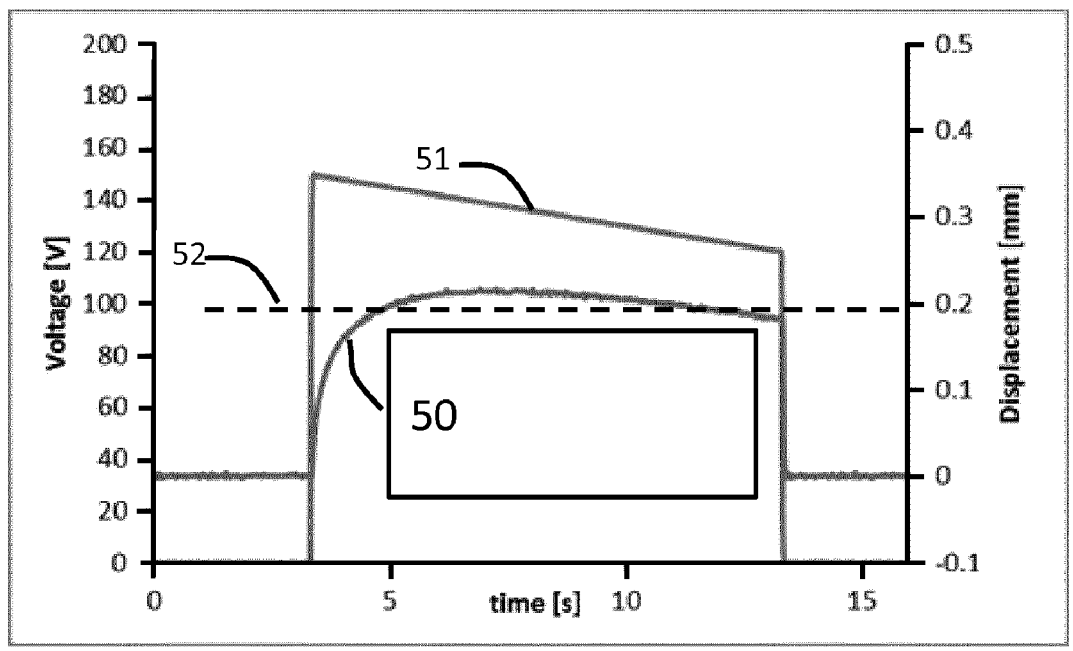
FIG. 5 shows a conventional drive scheme and a set of drive schemes in accordance with a second example. X-axis: 0 to 800 milliseconds with 50 ms/Div and Y axis: 0 to 330 Volts with 30 V/Div.
Figure 5B:
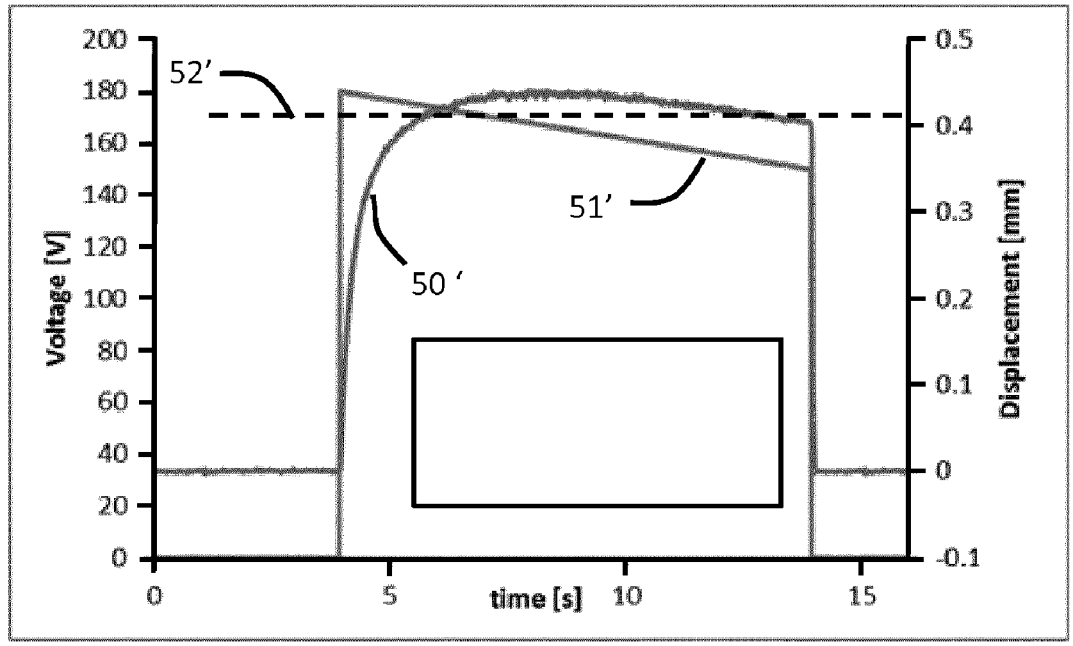
Figure 6A:
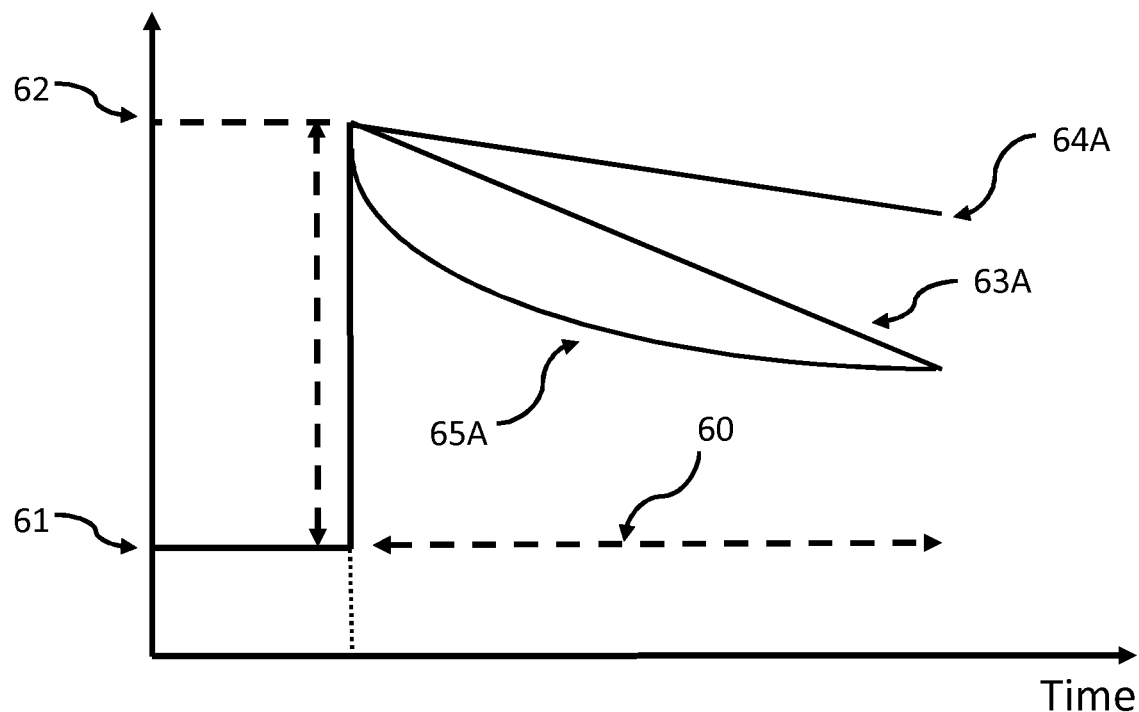
FIG. 6 shows a longer actuation pulse using a standard step drive voltage.
Figure 6B:
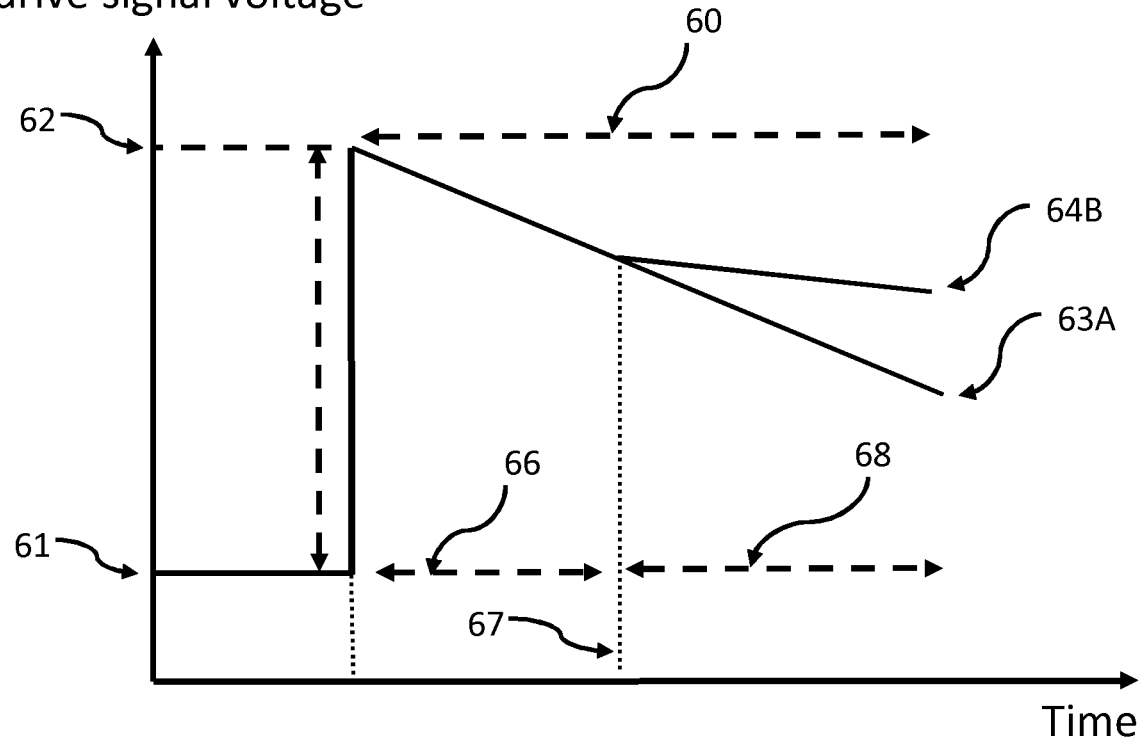
Figure 6C:
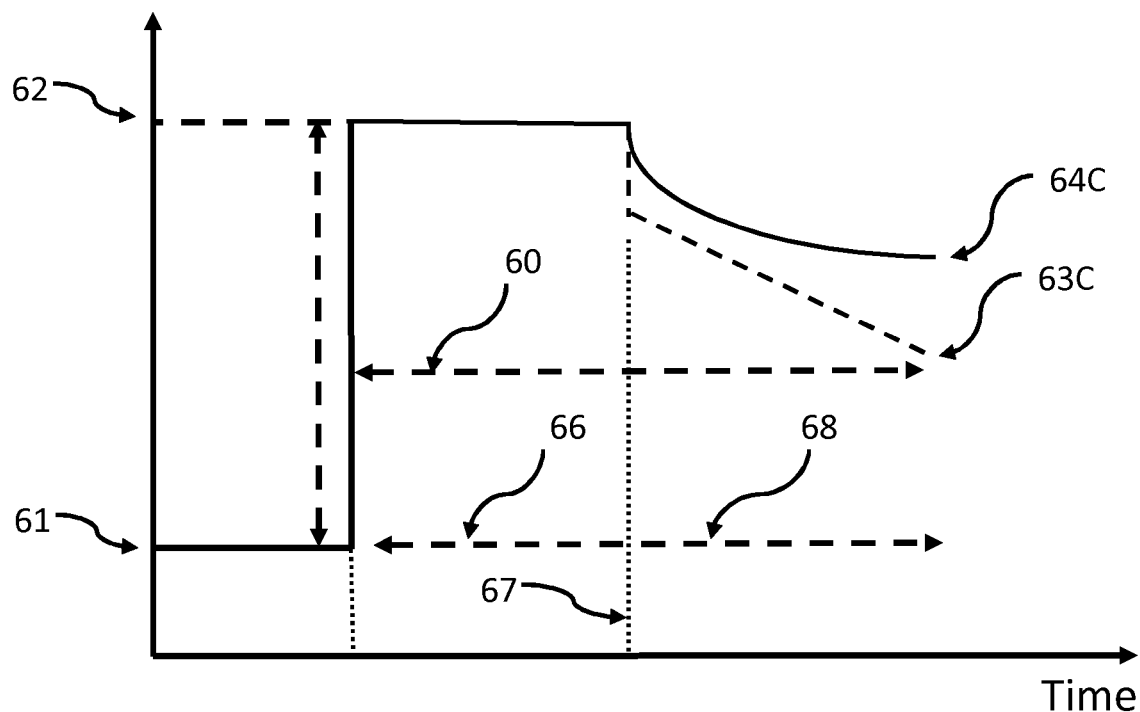
Figure 6D:
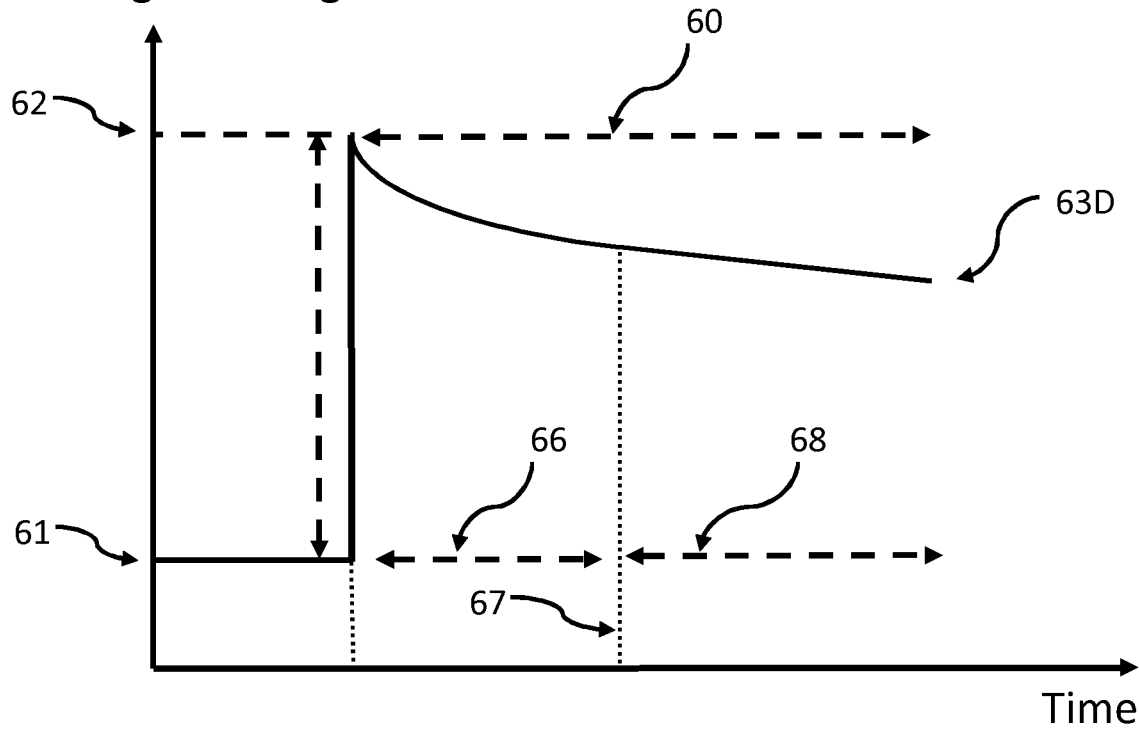

FIG. 5A shows, for the same actuator as that used to generate the response of FIGS. 3A and 3B, the displacement response 50 when a sloped drive signal 51 is used instead of the step voltage drive signal used in FIG. 3A. Especially after a few seconds following the rise of the signal 51, the displacement levels out more than is the case in FIG. 3A. It much better approaches the desired state of 0.2 mm displacement. A similar effect is seen in FIG. 5B but for a higher actuation state of 0.4 mm displacement, where a sloped drive signal 51' is used to generate a displacement response 50'.

The magnitude of levelling off and time it commences may be determined and adjusted using experiment to optimise the slope of the drive signal and/or the type of slope used and/or the time instance the slope starts. Although this will also affect the final displacement level reached, this level may also be adjusted using the drive signal magnitude after all, as can be seen from the comparison of FIGS. 5A and 5B, the latter showing an approximately twice as high displacement while levelling off of the displacement curve is approximately comparable.

FIGS. 6A to 6D show different examples of drive signals according to the invention. In all cases the voltage is initially increased in a first period from a first voltage 61 to an intermediate voltage 62 after which a decrease of the drive signal is implemented during a second period to start at some time after (preferably directly after) the first period.

If the curve 63A is assumed to be the one used in FIG. 5A, then in order to achieve a displacement curve 51 that is even more linear after approximately a time instance of 3 seconds, the slope of the drive voltage decrease may be reduced somewhat during the second period 60 (sometimes also indicated to be a holding period), for example as with curve 64A. Alternatively, the slope may be varied continuously with reduced slope as time progresses, as with the decay of curve 65A. Also, a delayed change of slope may be implemented as with curve 64B. In this curve (and similar ones) the holding period has two segments 66 and 68 separated by time instance 67 as of which the decay is adjusted. Another example is given in FIG. 6C. Here decay of slope starts only after time 67 whereas before that time no decay is implemented. Hence before time instance 67, mechanical output can be maximised as compared to the drive signals where decay starts as of the initial rise of the signal. Again, the decay can be monotonous as with curve 64C or with constant reduction of slope with time as with curve 63C. The drive signal 63D implements an immediately starting decay after initial rise, where in period 66 the decay is less than monotonous and after time 67 in period 68 is monotonous. The decrease of signal level during the second period 60 and/or one or more of the periods 66 and 68 may be in a continuous fashion as with signals 63A, 63B, 64A, 64B, 64C, 65A or in a stepwise fashion as for example with signal 63C which has a step decrease at time 67. A plurality of steps during the period 60 one or more having constant signal level can be implemented (not shown). More than two sup periods 66 and 68 can be used within second period 60.

The period 66 or a first part of this period can be used to charge the EAP structure. Thus, decay can start after this period or a part the part thereof to achieve a predetermined amount of charging, before voltage decay is implemented. Hence, the drive signal provides a good balance between achievable switching speed and actuation state holding response. The charging time is related to the time constant in e.g. equation 2. Thus, the charging voltage across the capacitor C1 reaches 63.2% of its final amplitude within the time constant $\tau$ and 99.3% after 5 times $\tau$. Hence the period 66 or the part thereof may be greater than $\tau$. More preferably it is greater than $5\tau$, even more preferable it is greater than $10\tau$ or even $50\tau$. Thus full charging is achieved before the decay strategy is employed. The timing for such charging period can be set by determining the relevant electrical parameters of the EAP structure (e.g. C1 and Rs) as indicated herein above. Thus timing can be optimised for any EAP structure used.

Hence, careful construction of the drive signal can tune the displacement behaviour of an EAP structure to obtain a nearly constant displacement as of a particular time which would not have been achieved if a simple step voltage drive signal were used.

A further improvement can be obtained by optimising the charging speed using an overdrive principle as described in non-prepublished European patent application number 16176918.7, which is herewith incorporated by reference and of which parts below are reproduced for explanation of implementation with the current invention.

The discussion with reference to FIG. 4, has been directed to the initial actuation of an EAP actuator based on electrical characteristics and this can be used to ensure that the actuator reaches a desired actuation state in an as efficient manner as possible.

Thus, while the voltage V1 provided by the driver between connections 43 and 44 is used to drive the EAP structure (equivalent circuit), it is the voltage across the capacitor C1, between connections 43 and 45 that determines the level of actuation or displacement. Thus, it is an important notion that upon switching of an EAP structure to a desired actuation level, the mechanical response of the EAP structure will not overshoot the desired actuation level if an overdrive voltage V1 is applied to the structure so long as the voltage across the capacitor remains below the voltage corresponding to the desired actuation level.

The higher overdrive voltage will have a limit since there will be a breakdown voltage for the device even with the capacitance discharged. Preferably voltages applied with the invention are below the breakdown voltage.

Overdriving provides an approach by which the desired charge level on the EAP is built up more quickly without disturbing reaching of the actual actuation level in an unwanted way (e.g with substantial overshoot). In order to accelerate the mechanical response time of the EAP structure, it is driven for a certain time at a higher voltage than the normal operation voltage (steady state voltage) required to reach the desired actuation position, so that the charging of the capacitor will be accelerated and hence the EAP heads towards an actuation state determined by this higher instantaneous charge level. As such it reacts faster than it would have done if operated only at its nominal operating voltage the voltage needed to reach the desired actuation state. This approach can be used to increase an actuation level more quickly, i.e. from rest or from a start actuation to a higher actuation.

When the envisaged final position is reached or about to be reached i.e. when the correct amount of charge Q associated with the desired displacement is present or almost present on the EAP capacitor C1, the driving voltage amplitude can be changed (e.g. reduced or increased) to a voltage to hold a constant position of the EAP actuator. Assuming a required voltage amplitude $V_0$ to reach a certain position of an EAP actuator, and further assuming that a higher voltage is applied, which can be considered to be an overdriving voltage $V_{od}$, to the EAP actuator, the capacitor voltage follows:

$$v_c(t) = V_0 = V_{od} \cdot (1 - e^{-\frac{t}{\tau}}) \quad \text{Eq. 3}$$

Finally, if the EAPs actuation position should be reached during a predetermined time t, the applied overdriving voltage can be calculated to be:

$$V_{od} = \frac{V_0}{(1 - e^{-\frac{t}{\tau}})} \quad \text{Eq. 4}$$

In a similar way, if the overdriving voltage $V_{od}$ is known, it can be estimated when, i.e. how fast, the EAP actuator will reach its required actuation position:

$$t_{od} = -\tau \cdot \left[ \ln\left(1 - \frac{V_0}{V_{od}}\right) \right] \quad \text{Eq. 5}$$

For implementing the overdriving principle of the invention, several driving topologies will be known by those skilled in the art. Accordingly, in the following circuit simulation an ideal and programmable voltage source is assumed.

As shown above, a required overvoltage can be determined if a certain EAP structure response time is requested.

In the following examples referring to FIGS. 7 and 8, actuation of an EAP structure is considered to the displacement state (desired actuation state) corresponding to a steady state voltage of 250 V. Also, the start actuation state is the rest state at zero volt. In a situation where the rest state is a non-zero volt state, then the overdrive voltage is to be added to or subtracted from the start state voltage level in order to determine the actual voltage applied to the actuation device. This is because the overdrive voltage is related to a voltage amplitude step in the drive signal.

Thus, for example, if a response time of 0.2 s is to be accomplished, the corresponding overdrive voltage can be calculated based on Eq. 4.

Figure 7:
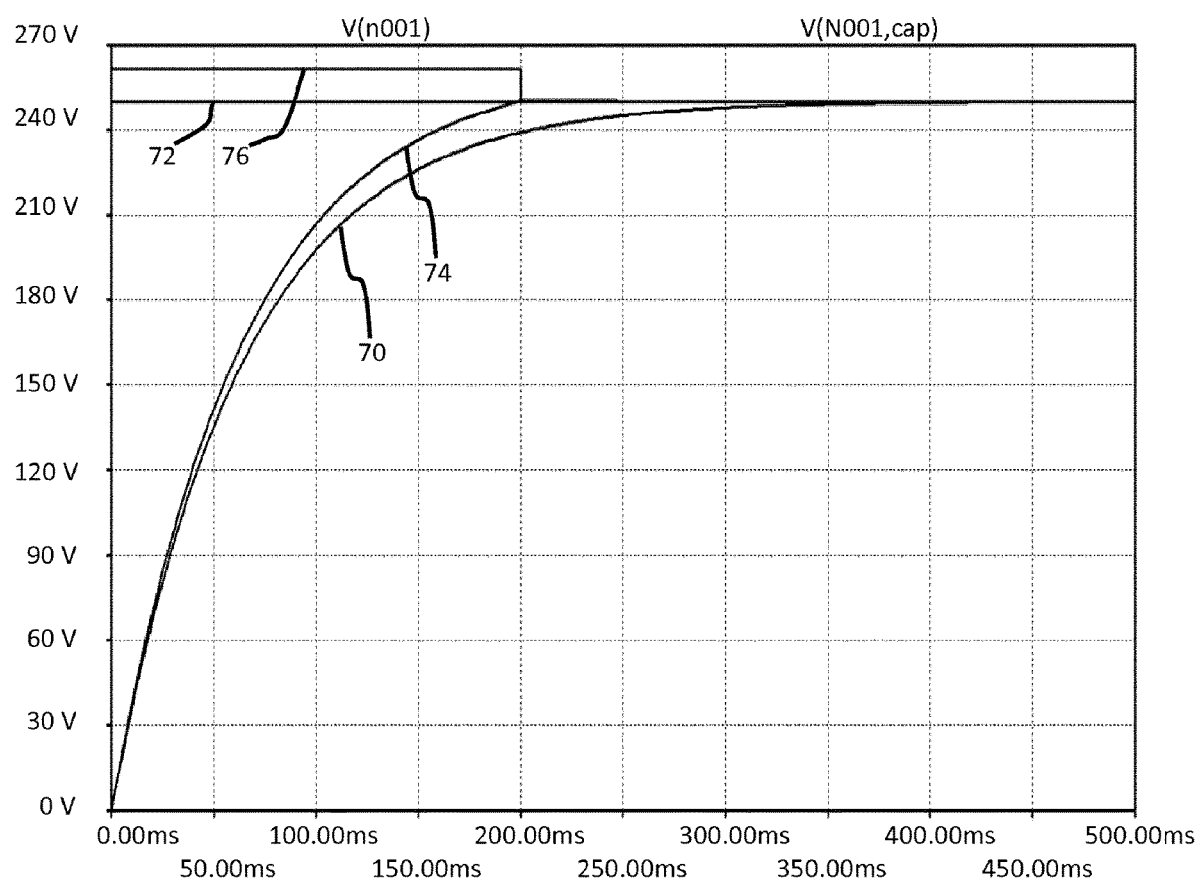
FIG. 7 shows the current, drive voltage and displacement.

In the case of FIG. 7, with an EAP structure having the equivalent components as provide herein above, an overdrive voltage of 261.5 V is provided for a time slot of 0.2 s, after which the applied voltage is reverted to the steady state voltage of 250 V.

The applied voltages and voltages over the effective capacitance of the EAP structure are shown in FIG. 7 with curves 70 and 74 of the voltage across (e.g. between nodes 33 and 35 in FIG. 4) the capacitor C1 (which voltage corresponds to the actuator displacement level; see herein above) as well as the drive voltages 72 and 76 as applied between nodes 33 and 34.

Plot 70 is the conventional response to a constant drive voltage 72 (in this case being the steady state voltage of 250 V) in following an initial step increase at time zero (with the EAP actuator in an initially discharged state corresponding to the rest or non-actuated state). Plot 74 is the response to a drive voltage having a higher first voltage 76 of 261.5 V for the first period, which in this example is 0.2 s after which period the voltage level is reverted to the steady state value of 250V. While usually the capacitor is fully charged after about 5τ (=0.32 s), the EAP actuator now reaches the required charge (and therefore voltage amplitude) after the defined 0.2 s. This amounts to a 30% decrease of response time.

In one set of examples, the invention relates to near dc driving of the actuator. What is meant by this is that the actuator is held at a dc level for a period which is comparable to or longer than the actuation time. Thus, the second drive voltage is maintained for at least as long as the first drive voltage. For the example of FIG. 7, the second voltage is held for at least 0.2 s. In this case, the overall duration of the actuation is at least 0.4 s, giving a maximum frequency of operation of 2.5 Hz.

The second drive voltage may be held for at least twice as long as the first drive voltage. In this case, the overall duration of the actuation is at least 0.6 s, giving a maximum frequency of operation of 1.7 Hz.

Thus, this aspect relates to slow, near dc, actuation. For example, the maximum frequency of operation may be below 10 Hz, for example below 5 Hz or even constant voltage.

FIG. 7 shows that the voltage across the capacitor C1 (which is an effective capacitance of the EAP actuator) is at or below the second drive voltage 72 while the EAP actuator is charging (during the voltage build-up of plot 70). In this way, the second drive voltage 72 is never exceeded across the capacitor C1 so that there is no overshoot of the mechanical response. Hence accurate positioning of the actuator can be reached and with faster response time.

As explained above, if the overdriving voltage is known (or e.g. limited by the maximum voltage applicable to the overall EAP actuator to prevent breakdown), the moment in time ($t_{active}$), when the EAP actuator reaches its required position (i.e. its corresponding charge) can be calculated according to Eq. 5 as well. This moment in time, can also be described as a dependency of the time constant τ of the EAP actuator itself:

$$t_{active} = n \cdot \tau \qquad \text{Eq. 6}$$

Accordingly, if the allowable amplitude of the overdrive voltage is known, the parameter n, when the EAP actuator reaches its requested position (charge) can be defined. For an overdrive voltage of $V_{od}=300$ V the response of the EAP actuator as modelled in these simulations is shown in FIG. 8.

Figure 8:
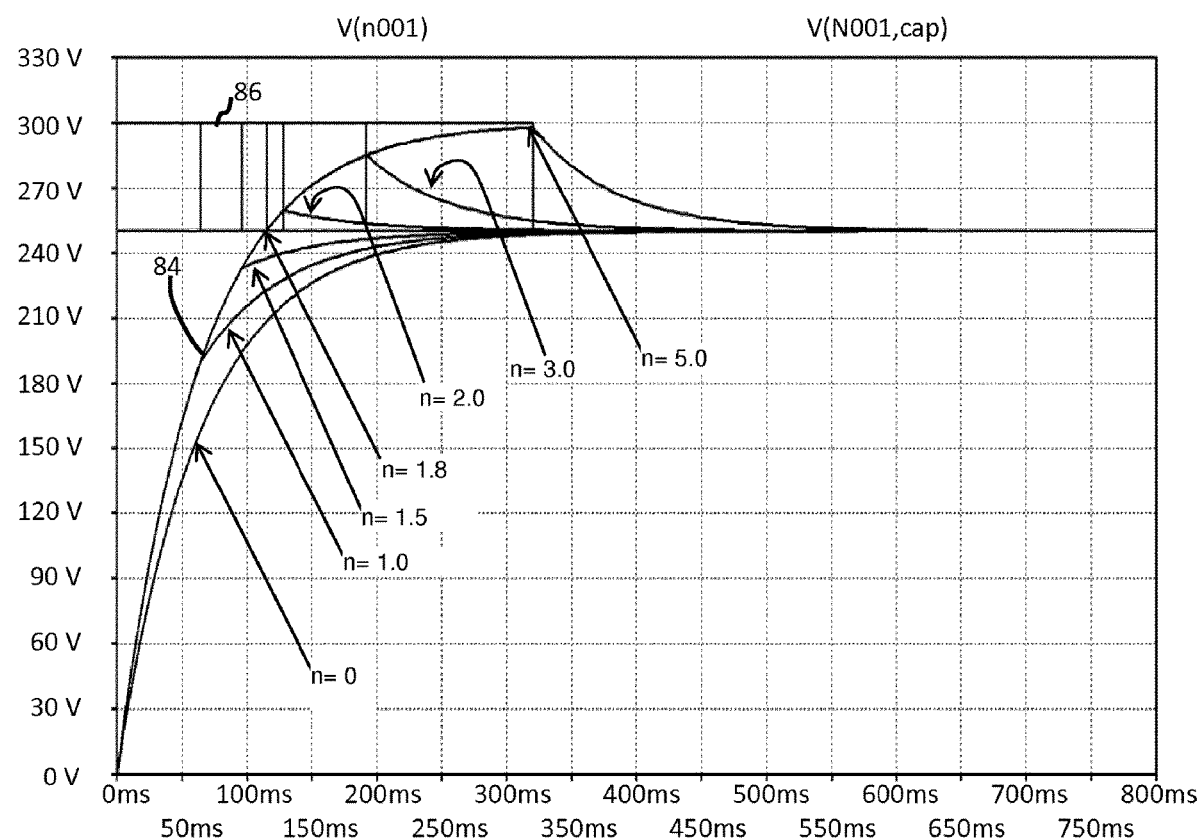
FIG. 8 shows how different portions of the actuation signal are affected by different relaxation mechanisms.

FIG. 8 shows a set of different time durations for the overdrive voltage 86 and a corresponding plot 84 for each. The plots 84 are labelled with the respective values of n (which are n=0, 1.0, 1.5, 1.8, 2.0, 3.0, 5.0). The overdrive voltage of 300 V for the respective voltage pulses 86 can be read from the FIG. 8 from the vertical lines marking the end of each of the overdrive pulses 86. The overdrive voltage for example needs to be applied for 0.115 s in order to reach the requested actuation position (i.e to reach the requested charge on and voltage over the effective capacitor C1). This corresponds to a parameter n=1.8, which means that the EAP-position can be reached faster by a factor of 0.32/0.115=2.78 than when only the steady state voltage of 250 V would have been used.

As can be seen from FIG. 8, if the period of time during which the overdrive voltage is applied to the EAP actuator is too short (e.g. n=1.0 or n=1.5), the response can be accelerated as well, but it is no longer optimal. On the other hand side, if the period of time during which the overvoltage is applied to the EAP actuator is too long (e.g. n=3.0 or n=5.0), the EAP actuator is over-driven and it takes even longer than the period of 5τ to reach the desired position because now the overshoot needs to be corrected. Note that this is a mechanical overdrive hence if mechanical output needs to be precise, this can be disturbing. The invention can prevent such mechanical overdrive.

This mechanical overshoot may however be used to advantage. For example, if the EAP actuator is being used as a form of haptic user interface, a response with slight overshoot may increase the effectiveness of the interaction whilst retaining a relatively smooth profile of the interface in steady state.

The first drive voltage may thus be applied until the voltage across the effective capacitance of the EAP actuator exceeds the second drive voltage by a predetermined amount, such that the voltage drops back to the second drive voltage subsequently. Such predetermined amount can be e.g. 50%, 20%, 10% 5%, 2%, 1%.

In such a case, the (intentional) overshoot may also be followed by a period of intentional lower applied voltage to decrease the time from the overshoot back to the desired steady state after the initial intentional overshoot. In this way, there e.g could be an increased sensation of the haptic response (a spike) but the response time is reduced. The lower voltage may thus comprise a third voltage, which is lower than the second voltage, and is applied between the first and second voltages.

Even in this case, there is a period of actuation at the desired end voltage preferably of a duration equal to or longer than the duration of the initial overdrive voltage. Thus, the haptic interface is still a low frequency operation.

This low frequency operation (less than 10 Hz as mentioned above) is far lower than a resonant frequency behaviour of the device. This resonant frequency typically ranges from about 40 Hz to about 60 Hz for a free standing device or for single edge clamped device (with typical length of about 10 mm) but could be 200 Hz to 400 Hz for a system clamped on both edges. The resonance frequency will depend on the design of the device.

As can be seen from the above investigations, the response time of an EAP actuator can be improved enormously by applying, for a certain period of time, a higher voltage to the EAP actuator than that required to reach a required position in steady state.

Also, it is known that the maximum applicable voltage or breakdown voltage of all polymers (so including EAPs) is time dependent. Thus, an EAP actuator can resist a higher maximum voltage for a short period of time. Therefore, the overdrive voltage can temporarily be increased above the maximum (long-term) working voltage of the EAP device without the risk of premature breakdown. In the above example, the maximum working voltage level or amplitude for the EAP actuators is 250 V, but for short periods of time, these EAP actuators can withstand higher voltages (up to 350 V for time periods in the 10-100 ms range).

The examples above for overdriving are based on a rectangular pulse-shaped overdrive voltage, which may be considered to be a rectangular overvoltage superposed over the normal drive voltage. The duration may be variable and may be related to the electrical time constant defined by the EAP actuator itself. The level or amplitude of the overdrive voltage may be variable as well and may even exceed a maximum working voltage level or amplitude of the EAP actuator due to the short nature of the overdriving pulse.

Non-rectangular voltage waveforms are possible. For example, the overdrive voltage may be reduced in amplitude over time. Ideally the overdrive voltage amplitude will be reduced to the nominal operation voltage when the required position of the EAP is reached (i.e. if the required charge level to reach the envisaged position is reached).

The accelerated behaviour as well as the transient response of the EAP device can be influenced by the shape of the signal applied to the component. Instead of applying an overdrive voltage with constant level or amplitude to the EAP actuator, any other linear or non-linear voltage form—with any arbitrary shape may be applied. In particular waveforms like multiple stepwise rectangular pulses (with the same or different duty cycles), exponential and logarithmic based profiles may be used, or combinations of these. This includes stepwise linear and non-linear voltage waveforms.

In general, the integral area under the voltage/time curve exceeds that of the steady state voltage and many different waveform shapes may be used.

Figure 9A:
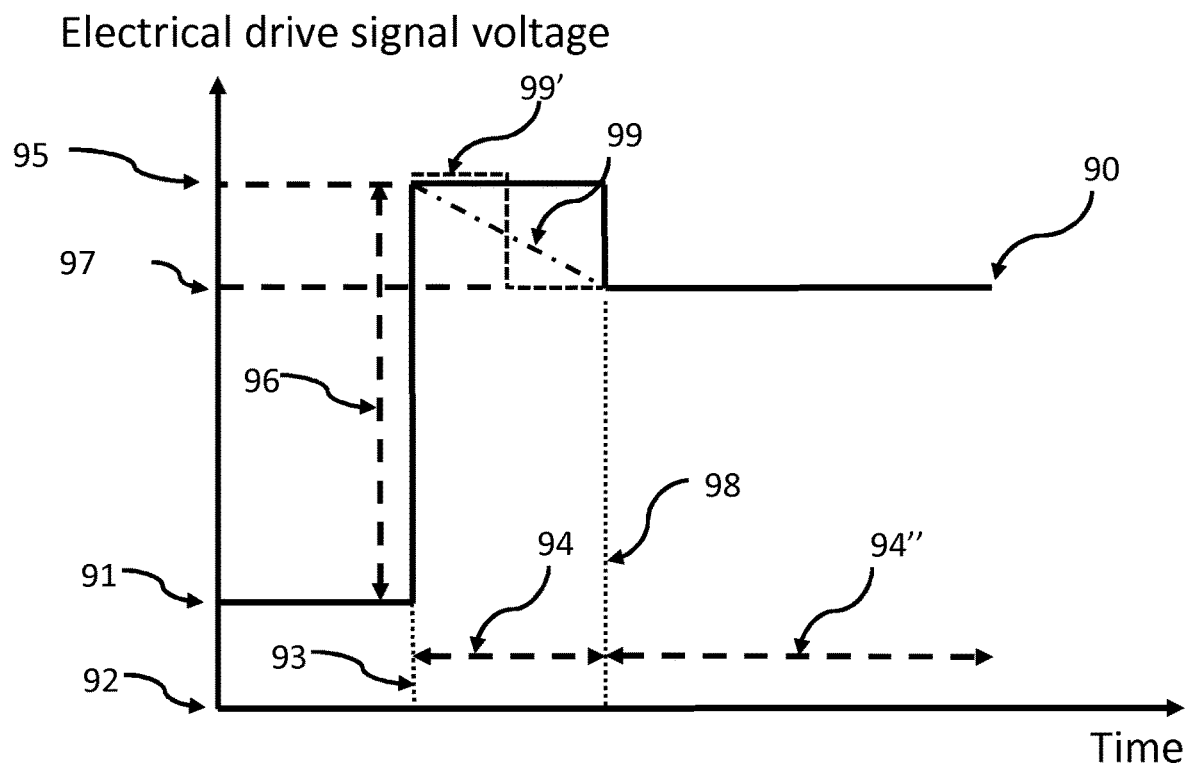
FIG. 9 shows a first drive voltage waveform for a long pulse to create a rectangular displacement profile.

The overdriving can be applied for switching of an actuator from lower actuation state (such as e.g. a rest state) to a more actuated state or vice versa. FIG. 9A shows an example drive signal waveform 90 for switching an actuator from a first actuation state associated with the first voltage 91 to a second actuation state associated with a second voltage 97. Thus, at first the actuator is driven with a first voltage 91 corresponding to a low actuation state. In this case the voltage 91 is higher than zero volt as zero volt is at level 92 and thus the first actuation state is in this case not the rest state. At time 93 overdrive period 94 starts and the drive signal voltage is increased to the overdrive voltage 95 by a change of voltage 96 where this change of voltage is larger than the difference between the second voltage 97 and first voltage 91 (the difference being defined as voltage 97 minus the voltage 91). Note that the change is a positive value as the voltage difference is positive. During the overdrive period 94, the overdrive voltage is maintained at constant level to be reduced to the second voltage 97 at its end at time 98. In an alternative embodiment, during the overdrive period 94, the overdrive voltage changes from value 95 to value 97. The change is e.g., linear with waveform 99 and stepwise with waveform 99'. The second voltage 97 is maintained constant during the holding period 94''.

In the switching situation of FIG. 9A, voltages were both positive and increasing for overdriving as switching occurred from a lower voltage state to a higher voltage state of an actuator. The invention works however in a similar way for the reverse situation where the same actuator is switched from higher actuation state to a lower actuation state.

Figure 9B:
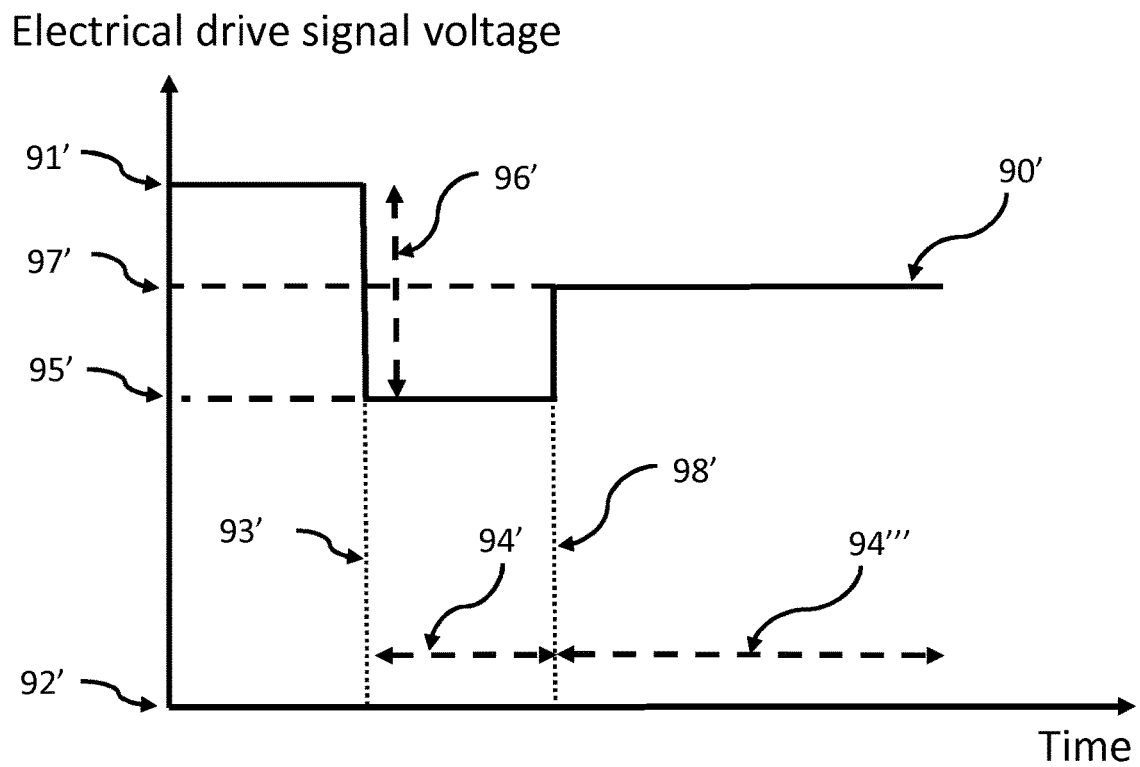

Thus, FIG. 9B shows an example drive signal waveform 90' for switching the actuator of FIG. 9A from a first actuation state associated with the first voltage 91' to a second actuation state associated with a second voltage 97'. In this case, the first voltage 91' is higher than zero volt as zero volt is at level 92'. Thus, at first the actuator is driven with a first voltage 91' corresponding to a high actuation state. At time 93' overdrive period 94' starts and the drive signal voltage is decreased to the overdrive voltage 95' by a change of voltage 96' where this change of voltage is larger than the difference between the second voltage 97' and the first voltage 91' and (the difference being define as voltage 97' minus the voltage 91'). Note that the change is a negative value as the difference between the voltage levels is negative. During the overdrive period 94', the overdrive voltage is maintained at constant level to be increased to the second voltage 97' at its end at time 98'. The holding voltage 97' is maintained constant during the holding period 94''.

In extreme cases the overdrive voltage 95' may even change sign so that a negative voltage is applied for example right up to the point where the voltage across the capacitance approaches the second voltage.

The overdrive scheme may be used to increase the slope of the initial change in displacement. Hence a certain desired actuation level 32 in FIGS. 3A and B, or 52 in FIG. 5A and 52' in FIG. 5B can be attained faster than without overdriving. While in FIGS. 7 and 8, as well as in FIGS. 9A and 9B the holding period has constant value drive signal at the second voltage, when the current invention is used, such second voltage would be the intermediate voltage from which during the second period a decrease of voltage level to the second voltage will occur.

Figure 10:
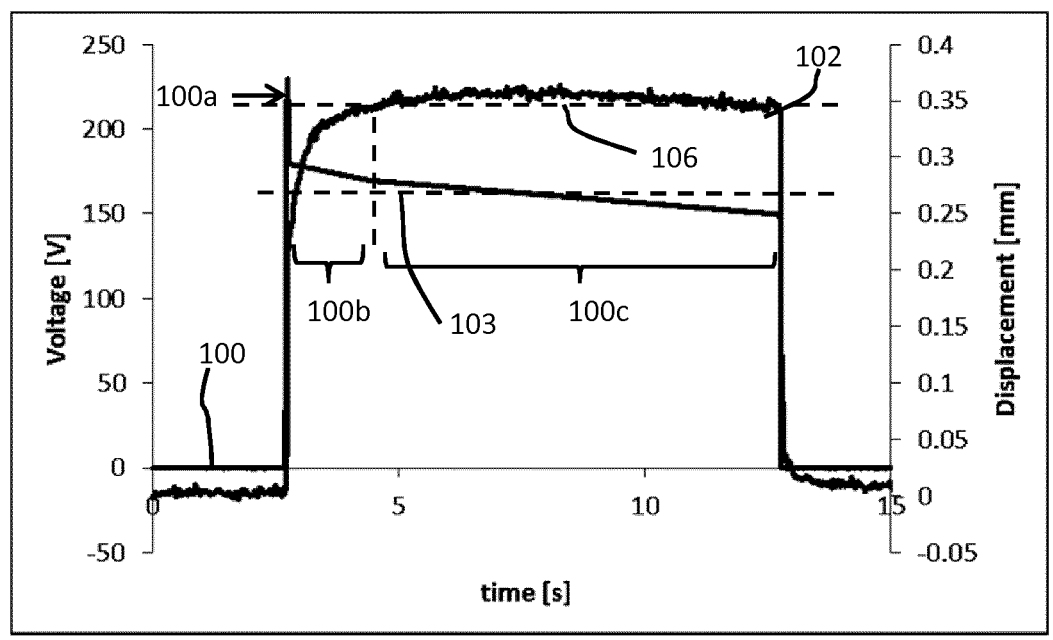
FIG. 10 shows a second drive voltage waveform for a long pulse to create a rectangular displacement profile.

FIG. 10 shows a first example driving scheme 100 of an EAP structure in which the voltage after an initial overdrive pulse in a first segment 100a has a shaped decrease towards the final target voltage during segments 100b and 100c.

The drive voltage 100 has three segments 100a, 100b, 100c to balance the displacement of the EAP actuator. The first segment makes use of an overdrive voltage 100a as explained above. Overdriving of the voltage enables the EAP actuator to be rapidly charged thereby to optimize the speed of displacement up to a first level 103. The duration of this voltage spike typically coincides with the charging of the EAP, and is for example less than 0.5 s, for example less than 0.3 s and may even be less than 0.1 s. It may be the same or less as the characteristic charging times mentioned in relation to Eq 2 and 6 and tuned to the EAP in question by using its electrical parameters.

The second segment makes use of a voltage 100b which decreases linearly to compensate for the displacement caused by non-electrical relaxation effects e.g. the molecular reorientation of the polymer chains in the EAP. The resulting displacement is now much more close to the desired level indicated with line 106. For comparison, recall from FIGS. 3A and 3B that if no compensation was used in the form of segments 100b and 100c, the displacement would have continued to increase as of the beginning of segment 100b to end up well above the level 106 at the end of the drive signal 100.

The second segment (which is the first portion of the decreasing phase) for example has a duration of between 0.5 and 5 s. The third segment makes use of a voltage 100c which decreases linearly to compensate for the displacement that can be e.g. caused by the molecular reorientation of the crystallites in the EAP (typically EAP materials are an amorphous matrix with a percentage of polymer organised in crystalline domains).

The third segment (which is the second portion of the decreasing phase) for example has a duration of between 1 and 20 s.

The first portion of the decreasing phase has a greater rate of decrease of voltage than the second portion of the decreasing phase. For example, the first portion has an average rate of decrease in the range of 2 to 20 V/s and the second portion has an average rate of decrease in the range 1 to 10 V/s. The rate of decrease in the second phase is for example less than half the rate of decrease in the first phase.

The overall ramp (having two segments in this example) down to the final voltage (150 V in this example) typically lasts at least 2 s, for example at least 5 s.

In FIG. 10, the drive signal is composed of an initial 230 V rectangular voltage pulse for 0.05 s (4600 V/s ramp rate) and step down to 180 V, followed by a 1.5 s ramp down from 180 V to 170 V in the second segment 100b and a further ramp down to 150 V in 8.5 s in the third segment 100c. The resulting displacement response is shown as plot 102. This end voltage of the combined ramp section may be considered to be a second voltage). As in the examples above, the second drive voltage lower is suitable for holding the electroactive polymer structure at the actuated state.

After these three driving segments, the voltage may also revert to a constant level consistent with the steady state actuation voltage of the actuator at the desired level of actuation—in this case 150 V.

Note that the drive voltages will be scaled as a function of the thickness of the EAP layer.

Note that the final voltage of the ramp section may not equal the holding voltage, so there may be another step voltage drop at the end of the ramp section.

The beginning of the ramp section 100b typically has a starting voltage at least 10% higher than the desired end voltage for the first 10 seconds of held actuation. If longer holding times are required, several ramp sections may be added to compensate for the continuing deformation. For instance a ramp with 1-5% voltage decrease per time decade (100 s-1000 s-10000 s) may be added to compensate for the ongoing relaxation effects.

The table below compares the key features of the actuator response of FIG. 10 with overdriving to the basic step voltage response of FIG. 3A.

| Driving | Voltage duration [s] | Final voltage [V] | Maximum voltage [V] | Average voltage [V] | Maximum displacement [mm] | Time to 90% displacement [s] | Average/Final displacement [%] |
|---|---|---|---|---|---|---|---|
| FIG. 3A | 10 | 150 | 150 | 150 | 0.25 | 6.4 | 83% |
| FIG. 10 | 10 | 150 | 230 | 162 | 0.36 | 0.6 | >99.5% |

It is clear that the maximum displacement for the same final voltage can be achieved at a much shorter time (in this example around 10 times faster) and that the displacement response is much more stable than the response as a function of a stepwise voltage.

The final displacement is also higher than the final displacement of a step voltage at the end of the actuation cycle. This also means that the average voltage on the EAP during actuation can be reduced to achieve the same final displacement as the step input response after 10 seconds. This is advantageous to both save power and to increase the lifetime of the EAP actuator.

The duration of the above described voltage segments as well as the voltages applied can have different values for differentiating mechanical actuation effect. The durations and voltages will generally be dependent on the EAP and to some extent the actuation structure involved. The EAP structure may be calibrated to determine the optimum values for achieving a desired effect. The voltages obtained during calibration can be stored in a lookup table as pairs of applied driving signals correlated to a timing. The overdrive "corrected" drive signals can then be retrieved from the table and used by the driver if specific actuation is indicated.

While the above methodology makes use of 3 driving segments, an improvement in response time with reasonable actuation level accuracy can also be achieved by only using 2 segments. Alternatively, more than 3 segments can be used to have available more operation parameters, for instance when even longer actuation times are needed.

Figure 11:
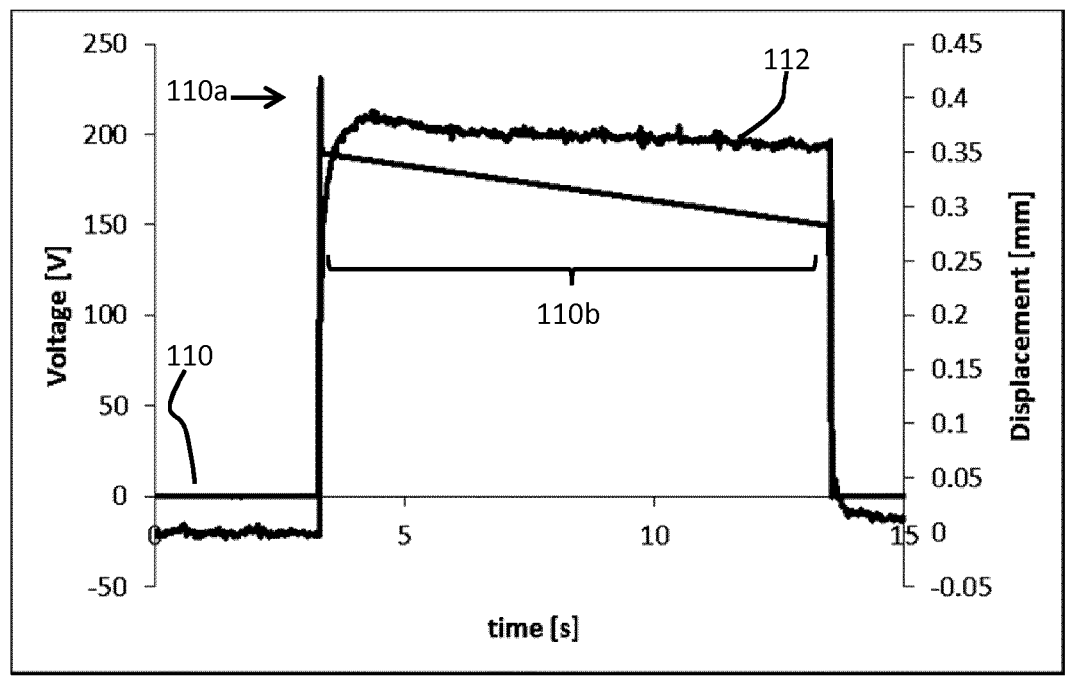
FIG. 11 shows an EAP actuator system.

FIG. 11 shows a drive voltage scheme 110 with three segments, i.e. with an overdrive voltage pulse 110a and a single linearly decaying voltage 110b, which results in a response 112 which is less ideal than the response 102, but may be good enough for applications where a fast response is more important than stability of the response over time during the rest of the actuation period. The second and third segments are now combined into one linear segment.

The voltage response can instead be further improved by optimising the driving scheme by adding more segments to the driving signal.

Voltages in any one or more of timing segments can be constant. Alternatively they can be decreasing monotonically or with other rate. This rate can be constant or non-constant such as progressive. The exact need of voltage per segment can be obtained through calibration as indicated herein before. Such calibration would e.g. require observing the mechanical behaviour over time under a specifically defined mechanical load (can be zero load, but also finite force or pressure load) as a function of firstly a constant drive (voltage or current) signal to determine behaviour under non-corrected driving conditions. Then similar measurements can be conducted using one or more segmented changed (lowered drive signals) to reduce the actuation state change observed under the first measurement.

Examples of decays have been given herein above with the discussion of FIGS. 6A to 6D.

In another example, a time delayed closed loop control may be implemented. The driving scheme may for example start with a high voltage overdriving signal as explained above. After this initial spike signal, a displacement (actuation state) sensor may be used to measure the response displacement (mechanical actuation state) over a certain time and correspondingly adjust the drive signal (e.g. voltage) on the EAP to compensate for time-delayed actuation state displacement effects. Separating the initial drive signal (e.g. voltage) spike and the closed loop operation has the advantage of allowing a relatively low frequency feedback loop system, which does not need to provide the fast response time which is needed for the initial drive signal (e.g. voltage) spike.

In another example, a continuous closed loop control may be implemented. The driving scheme again starts with a (e.g. high voltage) overdriving signal but the closed loop control is implemented from the start to regulate the drive signal (e.g. voltage) in order to achieve the desired position as soon as possible and maintain a stable displacement (i.e. within a certain band). The feedback loop can progressively slow down its operating frequency during a single actuation, to reduce power consumption of the driving and control electronics.

It is clear that in all examples above the speed of the response is strongly influenced by the high overdriving signal (e.g. voltage). For this reason, if a maximum response speed is required this signal should be chosen as close to the maximum allowable signal of the actuator (limited for example by the breakdown signal for an acceptable lifetime) as possible. This is also the case if only a relatively small change in actuation is required, for example if the final steady state voltage is only a few tens of volts.

However, it may be that choosing the maximum initial signal will make it more complicated to accurately and/or quickly reach the steady state actuation. Hence in the case that accuracy is of greater priority than speed, it may be preferred to use an initial overdrive signal which is lower than the maximum.

Thus, although not perse needed to attain a first actuation state, a large initial peak (overdrive) drive voltage may be used in the manner explained above, to rapidly drive the EAP structure (charge the capacitor defined by the EAP material and electrodes) and optimize the speed of displacement up to the desired level (for example level 103). This is then followed by one or more segments in the driving scheme that compensate for the delayed actuation response of the EAP which coincide with typical electrical or mechanical responses of the EAP actuator. These segments flatten (make it more constant) the displacement profile over time.

Figure 12:
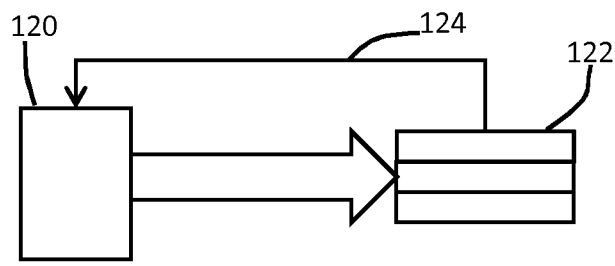
FIG. 12 shows an EAP actuator system including a driver and optional actuation and control feedback system.

FIG. 12 shows that a driver 120 is used to apply the drive signal (again in this case a voltage) to the EAP actuator 122. It also shows the optional feedback path 124 (mechanical, optical or electrical) used in some of the examples above.

The driver can include an electronic circuit with conventional PCB and discrete electrical elements. Alternatively it can be a semiconductor implemented device such as an IC as known in the art. The driver can be configured as a switching device using an external power source and from that generate and or switch power signals to the electroactive polymer structure. It may also include the power source such as a voltage source or a current source. There may also be a computer or CPU for controlling the electrical circuit of the driver. The drive signal usually is provided as a voltage to the electrodes of an EAP structure, such that it generates a voltage difference between them. A reference voltage such as zero volt may be used to ground one of the electrodes. The computer can be implemented in the driver, but can also be remotely connected (using standard wired or wireless connections as known in the art). Software stored (in a computer memory of any known type) or running on the computer can be present having code that makes the driver implement the driving. The software can have code to allow a user to provide parameter values. The software can be stored on a computer readable medium such as electronic memory as known in the art such as e.g. RAM or ROM, FLASH, SD etc., or on magnetic memory such as e.g. HDD and the like, or optical memory such as CD, DVD, Blu ray etc. or other. Alternatively, the software can be operable through or downloadable from a communications network such as 3G or 4G, LAN WAN, wired or wireless networks as e.g. known in the art.

The CPU including the memory may be located in a sub-device separate from a further sub-device that includes the actuator and thus the EAP structure. Both sub-devices thus being part of the device according to the invention. There are then also communication units such as wired, or wireless data transmitters and/or receivers located in the sub-device and further sub-device to allow the CPU to communicate with the driver to therewith implement remote control of the actuator. The sub-device may be a handheld control device of any sort, being dedicated for an application or general such as mobile phone, wearable device or similar device.

Since the EAP actuators mechanical response is not only defined by its electrical performance (other delays and dead-times may be added to the electrical delay) the applied overdrive voltage level and shape may be correlated and adapted to the combination of the total delay. Alternatively, the mechanical or optical feedback may be used to correlate the mechanical response to the electrical performance of the EAP actuator.

An electronic driver may be used to vary the output voltage as a function of time in the desired manner. This includes open loop control for example using a look-up table of overdrive voltage levels and amplitudes and time slot lengths. Alternatively, closed loop control may be used, having feedback sensor based settings. The feedback sensors may provide electrical, mechanical or optical feedback.

This invention relates in particular to actuation of EAP actuators comprising EAP as part of an EAP structure. The EAP structure thus comprises an EAP material. This is a material that can make the EAP structure deform upon providing an electrical signal to the EAP structure. As such the EAP material can be a mixture (homogeneous or heterogeneous) comprising or consisting of one or more matrix materials with one or more EAPs. This can for example be an EAP dispersion in a further polymer matrix material. The further polymer matrix material can be a network polymer that allows deformation invoked by the EAP mixed in or dispersed within the matrix network. The EAP material can be dispersed in it. Elastic materials are examples of such networks. Preferably the amount of EAP in such composite EAP materials is chosen from the group consisting of >50 weight or mole percent, >75 weight or mole percent or >90 weight or mole percent. EAP materials can also comprise polymers that contain in their molecules parts of EAPs (or EAP active groups) and parts of inactive other polymers. Many electroactive polymers can be used a number of which will be described below.

Within the subclass of field driven EAPs, a first notable subclass of field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment).

Another subclass of field driven EAPs is that of Dielectric Elastomers. A thin film of this material may be sandwiched between compliant electrodes, forming a capacitor such as a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). For this class of materials, electrodes are preferably mechanically attached either directly or with intermediate material layers to the EAP material.

For the first subclass of materials normally thin film metal electrodes are used since strains usually are in the moderate regime (1-5%), also other types of electrodes, such as e.g. conducting polymers, carbon black based oils, gels or elastomers, etc. can also be used. For the second class of materials typically type of electrode materials is constrained by the high strains. Thus for dielectric materials with low and moderate strains, metal electrodes and conducting polymer electrodes can be considered, for the high-strain regime, carbon black based oils, gels or elastomers are typically used.

A first notable subclass of ionic EAPs is Ionic Polymer Metal Composites (IPMCs). IPMCs consist of a solvent swollen ion-exchange polymer membrane laminated between two thin metal or carbon based electrodes and requires the use of an electrolyte. Typical electrode materials are Pt, Gd, CNTs, CPs, Pd. Typical electrolytes are Li+ and Na+ water-based solutions. When a field is applied, cations typically travel to the cathode side together with water. This leads to reorganization of hydrophilic clusters and to polymer expansion. Strain in the cathode area leads to stress in rest of the polymer matrix resulting in bending towards the anode. Reversing the applied voltage inverts bending. Well known polymer membranes are Nafion® and Flemion®.

Another notable subclass of Ionic polymers is Conjugated/conducting polymers. A conjugated polymer actuator typically consists of an electrolyte sandwiched by two layers of the conjugated polymer. The electrolyte is used to change oxidation state. When a potential is applied to the polymer through the electrolyte, electrons are added to or removed from the polymer, driving oxidation and reduction. Reduction results in contraction, oxidation in expansion.

In some cases, thin film electrodes are added when the polymer itself lacks sufficient conductivity (dimension-wise). The electrolyte can be a liquid, a gel or a solid material (i.e. complex of high molecular weight polymers and metal salts). Most common conjugated polymers are polypyrolle (PPy), Polyaniline (PANi) and polythiophene (PTh).

An actuator may also be formed of carbon nanotubes (CNTs), suspended in an electrolyte. The electrolyte forms a double layer with the nanotubes, allowing injection of charges. This double-layer charge injection is considered as the primary mechanism in CNT actuators. The CNT acts as an electrode capacitor with charge injected into the CNT, which is then balanced by an electrical double-layer formed by movement of electrolytes to the CNT surface. Changing the charge on the carbon atoms results in changes of C—C bond length. As a result, expansion and contraction of single CNT can be observed.

In relation to the above materials and with more detail, electro-active polymers thus can include, but are not limited to, the sub-classes: piezoelectric polymers, electromechanical polymers, relaxor ferroelectric polymers, electrostrictive polymers, dielectric elastomers, liquid crystal elastomers, conjugated polymers, Ionic Polymer Metal Composites, ionic gels and polymer gels.

The sub-class electrostrictive polymers includes, but is not limited to: Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoroethylene) (PVDF-TrFE-CTFE), Polyvinylidene fluoride-hexafluoropropylene (PVDF-HFP), polyurethanes or blends thereof.

The sub-class dielectric elastomers includes, but is not limited to: acrylates, polyurethanes, silicones.

The sub-class conjugated polymers includes, but is not limited to:

polypyrrole, poly-3,4-ethylenedioxythiophene, poly(p-phenylene sulfide), polyanilines.

Ionic devices may be based on ionic polymer-metal composites (IPMCs) or conjugated polymers. An ionic polymer-metal composite (IPMC) is a synthetic composite nanomaterial that displays artificial muscle behavior under an applied voltage or electric field.

In more detail, IPMCs are composed of an ionic polymer like Nafion or Flemion whose surfaces are chemically plated or physically coated with conductors such as platinum or gold, or carbon-based electrodes. Under an applied voltage, ion migration and redistribution due to the imposed voltage across a strip of IPMCs result in a bending deformation. The polymer is a solvent swollen ion-exchange polymer membrane. The field causes cations travel to cathode side together with water. This leads to reorganization of hydrophilic clusters and to polymer expansion. Strain in the cathode area leads to stress in rest of the polymer matrix resulting in bending towards the anode. Reversing the applied voltage inverts the bending.

The electrodes of the EAP structure can have many configurations each with specific advantages and effects.

If the plated electrodes are arranged in a non-symmetric configuration, the imposed signals (e.g. voltage) can induce all kinds of deformations such as twisting, rolling, torsioning, turning, and non-symmetric bending deformation of the EAP structure. In all of these examples, additional passive layers may be provided for influencing the electrical and/or mechanical behavior of the EAP material layer in response to an applied electric field or current.

The EAP material layer of each unit may be sandwiched between electrodes. Alternatively, electrodes can be on a same side of the EAP material. In either case, electrodes can be physically attached to the EAP material either directly without any (passive) layers in between, or indirectly with additional (passive) layers in between. But this need not always be the case. For relaxor or permanent piezoelectric or ferroelectric EAPs, direct contact is not necessary. In the latter case electrodes in the vicinity of the EAPs suffices as long as the electrodes can provide an electric field to the EAPs, the Electroactive polymer structure will have its actuation function. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The invention can be applied in many EAP, including examples where a matrix array of actuators is of interest.

In many applications the main function of the product relies on the (local) manipulation of human tissue, or the actuation of tissue contacting interfaces. In such applications EAP actuators for example provide unique benefits mainly because of the small form factor, the flexibility and the high energy density. Hence can be easily integrated in soft, 3D-shaped and/or miniature products and interfaces. Examples of such applications are:

Skin cosmetic treatments such as skin actuation devices in the form of a responsive polymer based skin patches which apply a constant or cyclic stretch to the skin in order to tension the skin or to reduce wrinkles;

Respiratory devices with a patient interface mask which has a responsive polymer based active cushion or seal, to provide an alternating normal pressure to the skin which reduces or prevents facial red marks;

Electric shavers with an adaptive shaving head. The height of the skin contacting surfaces can be adjusted using responsive polymer actuators in order to influence the balance between closeness and irritation; Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of responsive polymer transducers which is integrated in or near the user interface;

Catheters with a steerable tip to enable easy navigation in tortuous blood vessels.

Another category of relevant application which benefits from such actuators relates to the modification of light. Optical elements such as lenses, reflective surfaces, gratings etc. can be made adaptive by shape or position adaptation using these actuators. Here one benefit of EAPs for example is a lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A method of driving an actuator, the actuator comprising an electroactive polymer structure for adopting at least a first actuation state and a second actuation state different from the first actuation state, the first actuation state having a first drive level associated with it and the second actuation state having a second drive level associated with it, and the method comprising:

applying a drive signal having a drive signal level to the electroactive polymer structure for switching it from the first actuation state to the second actuation state, wherein the drive signal comprises:

a first period in which the drive signal level is changed from the first drive level to an intermediate level which exceeds the second drive level, and after the first period, a second period in which the drive signal level decreases from the intermediate level to the second drive level, wherein the intermediate level is at least 5% higher than the second drive level and the second period is equal to or longer than 0.5 second.

2. The method as claimed in claim 1, wherein after the second period, the drive signal level is constant at the second drive level.

3. The method as claimed in claim 1, wherein the intermediate level is at least 10% or at least 20% higher than the second drive level.

4. The method as claimed in claim 1, wherein:

the electroactive polymer structure comprises an electrode arrangement for receiving the drive signal, the electrode arrangement defining a capacitor having an electrical capacitance in series connection with a resistance, a product of the electrical capacitance and resistance defining a characteristic time constant for charging the capacitor during the first period, and in which the first period is equal to or longer than a product of a factor and the characteristic time constant where the factor is chosen from a group consisting of: 2, 5, 10, 20, 50, and 100.

5. The method as claimed in claim 1, wherein the drive signal level during at least a portion of the second period decreases over time in a continuous or stepwise fashion.

6. The method as claimed in claim 1, wherein during the second period, the drive signal level decreases over time as a first portion and a subsequent second portion with different average rates of decrease.

7. The method as claimed in claim 6, wherein a rate of decrease of the drive signal level during one or more of the entire second period, the first portion, and the second portion is:

constant over time, or
decreasing over time.

8. The method as claimed in claim 6, wherein the first portion has a duration of between 0.5 and 5 seconds and the second portion has a duration exceeding 1 second.

9. The method as claimed in claim 1, wherein during at least a part of the first period, the drive signal comprises an overdrive level, wherein a level difference between the overdrive level and the first drive level exceeds a level difference between the intermediate level and the first drive level.

10. The method as claimed in claim 9, wherein:

the electroactive polymer structure comprises an electrode arrangement for receiving the drive signal, the electrode arrangement defining a capacitor having an electrical capacitance, and a level across the electrical capacitance is at or below the second drive level during application of the overdrive level.

11. A computer program product, comprising computer readable code stored on, or storable on a computer readable medium, or downloadable from a communications network, which computer readable code when run on a computer is capable of causing a driver to implement the steps of the method of claim 1.

12. The device as claimed in claim 1, further comprising a feedback system for controlling duration, amplitude, and/or shape of the drive signal during the second period.

13. The device as claimed in claim 12, wherein the feedback system for example comprises a displacement sensor or a closed loop driver control for regulating the drive signal level.

14. A device comprising:

an actuator including an electroactive polymer structure for adopting at least a first actuation state and a second actuation state different from the first actuation state, the first actuation state having a first level associated with it and the second actuation state having a second level associated with it, and a driver adapted to apply a drive signal having a drive signal level to the electroactive polymer structure for switching it from the first actuation state to the second actuation state, wherein the drive signal comprises:

a first period in which the drive signal level is changed from the first level to an intermediate level which exceeds the second level, and after the first period, a second period in which the drive signal level decreases from the intermediate level to the second level, wherein the intermediate level is at least 5% higher than the second level and the second period is equal to or longer than 0.5 second.

15. The device as claimed in claim 14, wherein:

the electroactive polymer structure comprises an electrode arrangement for receiving the drive signal, the electrode arrangement defining a capacitor having an electrical capacitance, and during at least a part of the first period, the drive signal comprises an overdrive level, wherein a level difference between the overdrive level and the first level exceeds a level difference between the intermediate level and the first level and a level across the electrical capacitance is at or below the second level during application of the overdrive level.

16. The device as claimed in claim 14, wherein the device comprises a memory storing a computer program product.

* * * * *